United States Patent
Katou

(10) Patent No.: US 8,027,184 B2
(45) Date of Patent: Sep. 27, 2011

(54) SEMICONDUCTOR STORAGE DEVICE AND OPERATING METHOD OF THE SAME

(75) Inventor: Yuukou Katou, Tokyo (JP)

(73) Assignee: NEC Corporation, Tokyo (JP)

( * ) Notice: Subject to any disclaimer, the term of this patent is extended or adjusted under 35 U.S.C. 154(b) by 617 days.

(21) Appl. No.: 12/282,163

(22) PCT Filed: Mar. 5, 2007

(86) PCT No.: PCT/JP2007/054160
§ 371 (c)(1),
(2), (4) Date: Sep. 8, 2008

(87) PCT Pub. No.: WO2007/102456
PCT Pub. Date: Sep. 13, 2007

(65) Prior Publication Data
US 2009/0073742 A1    Mar. 19, 2009

(30) Foreign Application Priority Data

Mar. 6, 2006 (JP) .................................. 2006-059478

(51) Int. Cl.
*G11C 11/00* (2006.01)
(52) U.S. Cl. .......................... 365/158; 365/148; 365/163
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS 6,259,644 B1    7/2001    Tran et al.
(Continued)

FOREIGN PATENT DOCUMENTS

JP    2002-170377    6/2002
(Continued)

OTHER PUBLICATIONS

A 10ns Read and Write Non-Volatile Memory Array Using a Magnetic Tunnel Junction and FET Switch in each Cell, Roy Scheuerleun et al., ISSCC 2000/ SESSION 7, TD: Emerging Memory & Device Technologies, Paperta 7.2, Feb. 2000.

(Continued)

*Primary Examiner* — Richard Elms
*Assistant Examiner* — Harry Byrne
(74) *Attorney, Agent, or Firm* — Young & Thompson

(57) ABSTRACT

A semiconductor storage device includes: reading blocks; third wirings; reading switches; a control circuit; and evaluating circuits. The reading blocks includes first and second wirings extended in a first and second direction, respectively, and resistive storage elements arranged at points where the first and second wirings intersect. The third wirings is extended in the second direction and provided correspondingly to the second wirings. The reading switches are arranged between the third and second wirings. The control circuit controls the reading switches and supplies currents or the like to the first wirings. The evaluating circuits are connected to the third wirings and evaluate the currents or the like. When data is read out, the control circuit selects a selection reading block and a selection first wiring and supplies the currents or the like, and the evaluating circuits execute the evaluations of the currents or the like in the third wirings.

15 Claims, 14 Drawing Sheets

U.S. PATENT DOCUMENTS

| | | | |
|---|---|---|---|
| 6,778,430 B2* | 8/2004 | Hidaka | 365/171 |
| 7,254,057 B2* | 8/2007 | Hidaka | 365/171 |
| 7,342,822 B2* | 3/2008 | Ezaki et al. | 365/158 |
| 7,489,001 B2* | 2/2009 | Hidaka | 257/295 |
| 7,505,305 B2* | 3/2009 | Hidaka | 365/158 |
| 2003/0156448 A1* | 8/2003 | Hidaka | 365/171 |
| 2004/0027854 A1* | 2/2004 | Iwata et al. | 365/158 |
| 2005/0180083 A1* | 8/2005 | Takahara et al. | 361/152 |
| 2006/0256461 A1* | 11/2006 | Ezaki et al. | 360/1 |
| 2007/0091670 A1* | 4/2007 | Hidaka | 365/158 |
| 2007/0147110 A1* | 6/2007 | Hidaka | 365/171 |
| 2009/0073742 A1* | 3/2009 | Katou | 365/148 |
| 2009/0141540 A1* | 6/2009 | Miura et al. | 365/158 |

FOREIGN PATENT DOCUMENTS

| | | |
|---|---|---|
| JP | 2002-170379 | 6/2002 |
| JP | 2002-269968 | 9/2002 |
| JP | 2003-007982 | 1/2003 |
| JP | 2003-318370 | 11/2003 |
| JP | 2004-206796 | 7/2004 |
| JP | 2004-213771 | 7/2004 |
| JP | 2005-101535 | 4/2005 |
| JP | 2005-182986 | 7/2005 |
| JP | 2005-522045 | 7/2005 |
| JP | 2006-4479 | 1/2006 |

OTHER PUBLICATIONS

Nonvolatile RAM based on Magnetic Tunnel Junction Elements, ISSCC 2000, Session 7,TD: Emerging Memory & Device Technologies, Paper TA 7.3, M. Dulani et al., Feb. 2000.

* cited by examiner

Fig. 9

| Rtr/Rj | n-1 | | | | | | |
|---|---|---|---|---|---|---|---|
| | 3 | 7 | 15 | 31 | 63 | 127 | 255 |
| 0.0001 | 333 | 333 | 332 | 332 | 330 | 326 | 320 |
| 0.001 | 331 | 329 | 325 | 316 | 301 | 272 | 227 |
| 0.01 | 314 | 295 | 261 | 209 | 143 | 79 | 35 |
| 0.1 | 198 | 126 | 64 | 26 | 9 | 3 | 1 |
| 1 | 21 | 6 | 2 | 0 | 0 | 0 | 0 |

Fig. 10

| Rtr/Rj | n-1 | | | | | | |
|---|---|---|---|---|---|---|---|
| | 3 | 7 | 15 | 31 | 63 | 127 | 255 |
| 0.0001 | 263 | 170 | -16 | -386 | -1122 | -2570 | -5379 |
| 0.001 | 263 | 171 | -9 | -356 | -999 | -2107 | -3771 |
| 0.01 | 263 | 183 | 48 | -146 | -356 | -484 | -468 |
| 0.1 | 238 | 185 | 128 | 79 | 45 | 24 | 13 |
| 1 | 27 | 10 | 4 | 2 | 1 | 0 | 0 |

Fig. 12

| Rtr/Rj | n-1 | | | | | | |
|---|---|---|---|---|---|---|---|
| | 3 | 7 | 15 | 31 | 63 | 127 | 255 |
| 0.0001 | 333 | 333 | 332 | 331 | 329 | 325 | 317 |
| 0.001 | 331 | 328 | 323 | 313 | 294 | 259 | 199 |
| 0.01 | 311 | 288 | 245 | 176 | 78 | -35 | -139 |
| 0.1 | 173 | 67 | -46 | -143 | -210 | -251 | -274 |
| 1 | -39 | -95 | -128 | -146 | -155 | -159 | -162 |

Fig. 15

| Rtr/Rj | n-1 | | | | | | |
|---|---|---|---|---|---|---|---|
| | 3 | 7 | 15 | 31 | 63 | 127 | 255 |
| 0.0001 | 333 | 333 | 332 | 331 | 329 | 325 | 317 |
| 0.001 | 331 | 328 | 323 | 313 | 294 | 259 | 199 |
| 0.01 | 311 | 287 | 245 | 177 | 81 | -28 | -120 |
| 0.1 | 173 | 69 | -39 | -122 | -165 | -168 | -142 |
| 1 | -36 | -82 | -98 | -91 | -70 | -46 | -27 |

Fig. 16

| Rtr/Rj | n-1 | | | | | | |
|---|---|---|---|---|---|---|---|
| | 3 | 7 | 15 | 31 | 63 | 127 | 255 |
| 0.0001 | 333 | 331 | 328 | 322 | 311 | 289 | 245 |
| 0.001 | 331 | 327 | 321 | 308 | 284 | 240 | 164 |
| 0.01 | 311 | 288 | 247 | 179 | 85 | -22 | -113 |
| 0.1 | 173 | 70 | -38 | -121 | -164 | -166 | -141 |
| 1 | -36 | -82 | -98 | -91 | -70 | -46 | -27 |

SEMICONDUCTOR STORAGE DEVICE AND OPERATING METHOD OF THE SAME

TECHNICAL FIELD

The present invention relates to a semiconductor storage device and an operating method of the same, and more particularly relates to a semiconductor storage device in which a resistive storage element is used as a memory cell, and an operating method of the same.

BACKGROUND ART

A semiconductor storage device (memory) is known in which a resistive storage element whose resistance value is changed based on its state is used as a memory cell. The magnetoresistive element and the phase-change resistive element are known as the resistive storage elements. The magnetoresistive element indicates a magnetoresistance effect such as an AMR (Anisotropic MagnetoResistance) effect, a GMR (Giant MagnetoReistance) effect and a TMR (Tunnel MagnetoResistance) effect. The phase-change resistive element uses a difference between crystalline properties caused by cooling speeds.

At first, as one example of the magnetoresistive element, the TMR element will be described. The TMR element has the structure in which a tunnel insulating film is put between two magnetic materials. FIG. 1 is a sectional view showing one example of the TMR element, which is disclosed in 2000 IEEE International Solid-State Circuits Conference DIGEST OF TECHNICAL PAPERS (p. 128). The TMR element (magnetoresistive element) 205 has a structure in which an antiferromagnetic layer 201, a pinned layer 202, a tunnel insulating layer 203 and a free layer 204 are laminated in this order. The antiferromagnetic layer 201 is made of, for example, FeMn (10 nm). The pinned layer 202 is made of, for example, ferromagnetic material CoFe (2.4 nm). The tunnel insulating layer 203 is made of, for example, $Al_2O_3$ (2 nm). The free layer 204 is made of, for example, ferromagnetic material NiFe (5 nm). Conductive wirings are connected to the antiferromagnetic layer 201 and the free layer 204 so that voltages can be applied. The magnetization direction of the pinned layer 202 is pinned in a certain direction by the antiferromagnetic layer 201. The free layer 204 is formed to be easily magnetized in a certain direction, and the magnetization direction can be changed when a magnetic field is applied from outside. In the horizontal direction of the free layer 204, a direction in which it is easy to magnetize the free layer 204 is referred to as an easy axis, and a direction which is vertical to the easy axis and in which it is hard to magnetize the free layer 204 is referred to as a hard axis. When the voltage is applied between the free layer 204 and the pinned layer 202, a current flows through the tunnel insulating layer 203. At that time, based on the relation between the direction of the magnetization of the free layer 204 and the direction of the magnetization of the pinned layer 202, the resistance value is changed. That is, when the directions of the magnetizations are the same, the resistance value is low, and when the directions of the magnetizations are opposite, the resistance value is high.

One example of using the TMR element as the storage element of a semiconductor storage device will be described below. FIG. 2 is a perspective view showing one example of a semiconductor storage device, which is disclosed in 2000 IEEE International Solid-State Circuits Conference DIGEST OF TECHNICAL PAPERS (p. 130). This nonvolatile memory 215 uses the TMR element as the storage element. In the nonvolatile memory 215, pairs of intersected wirings (bit lines 206 and write word lines 209) are provided on and under TMR elements 205 arranged in an array shape. The bit line 206 is connected to the free layer 204 of the TMR element 205. The write word line 209 is separately provided below the antiferromagnetic layer 201 of the TMR element 205. The antiferromagnetic layer 201 of the TMR element 205 is connected to the drain of a transistor 208 formed in a lower layer through a third wiring 207. The transistor 208 is turned on/off by a read word line 210.

A data is written to this TMR element 205, as follows. Since a current flows through the bit line 206 and the write word line 209, a synthesis magnetic field is generated in the vicinity of the intersection. The synthesis magnetic field changes the direction of the magnetization of the free layer 204 in the TMR element 205 which is located at the intersection. The direction of the magnetization is set by the direction of the current. Consequently, the resistance value of the TMR element 205 can be changed. The data is read from this TMR element 205, as follows. The transistor 208 connected to the TMR element 205 from which the reading is executed is turned on by the read word line 210. Then, a voltage is applied to the TMR element 205 through the bit line 206, and the resistance value of the TMR element 205 is evaluated based on the current flowing through the TMR element 205.

Also, U.S. Pat. No. 6,259,644 discloses a data reading method of a cross point type memory array in which resistive storage elements are used. FIG. 3 is a schematic block diagram describing an equivalent potential reading method (hereafter, referred to as a EP method) disclosed in U.S. Pat. No. 6,259,644. In a cross point type memory array 235, a memory cell 222 (TMR element) is connected between a bit line 220 and a word line 222 that intersect each other. In the EP method, a voltage source 223 applies a voltage Vs to the word line 221 connected to the memory cell 222 from which the reading is executed, and the other word lines are grounded. Moreover, a potential setting circuit 224 is connected to the bit line 220 connected to the memory cell 222 from which the reading is executed, and the other bit lines are grounded. The potential setting circuit 224 is composed of a differential amplifier 225 and a feedback resistor 226. One input of the differential amplifier 225 is grounded, and the other input is connected to the bit line 220. Moreover, the potential of the bit line 220 to which the output of the differential amplifier 225 is connected through the feedback resistor 226 is set at a zero potential. With such setting, the bit line 220 and the word line 221 from which the reading is not executed have the zero potentials. Thus, there is no leakage current from the memory cell 222, from which the reading is not executed, on the bit line from which the reading is executed. Hence, the output potential of the potential setting circuit 224 corresponds to the resistance value of the memory cell 222 from which the reading is executed. When this potential is supplied to a sensing amplifier 227 and compared with a referential potential Vref, the data can be judged.

In this way, as the typical memory array in the semiconductor storage device, there are a 1Tr+1R type (Tr: Transistor, R: Resistive storage element) and a cross point type. Here, in the 1Tr+1R type, a selection transistor (208) is connected for each storage element (TMR element 205), and the writing/reading is controlled in the bit line (206) and the word lines (209, 210) which intersect each other. In the cross point type, the storage element (222) is connected at the intersection between the bit line (220) and the word line (221). In the 1Tr+1R type, when the reading is executed, it is possible to evaluate the resistance value for each storage element, which enables the reading even from the region where a change amount of the resistance value is small. However, since the area of the selection transistor and the area for the connection are required, it is difficult to employ it for making a higher-capacity memory with a hyperfine structure. On the contrary, in the cross point type, the memory cell area can be made small. However, since all of the storage elements are connected in parallel, it is difficult to accurately evaluate the resistance value of one storage element. In order to cope with this difficulty, the EP method is proposed as the effective reading method. According to this method, it is possible to ideally evaluate the resistance value of each storage element as mentioned above.

However, actually, the EP method has a problem that the output is shifted, depending on the wiring resistance. With reference to FIG. 3, in the memory cell 235, 200 μm on a side, the resistance value of the wiring is about 40Ω as an example. When a read voltage Vs is assumed to be 0.5 V and the resistance value of the memory cell 222 is assumed to have the two values of 10 kΩ (tentatively, the data is assumed to be "0") and 15 kΩ (tentatively, the data is assumed to be "1"), the flowing currents become 50 μA ("0") and 33 μA ("1").

When the data is read from the memory cell 222 on the word line 221 that is closest to the potential setting circuit 224 connected to the bit line 220, the read currents are 50 μA ([0]) and 33 μA ([1]), and its difference is 17 μA. However, in the memory cell 222 on the word line 221 that is far away from the potential setting circuit 224, the wiring resistance value of the bit line 220 causes the voltage to be increased by 2 mV. The wiring of the memory cell 220 from which the reading is not executed is grounded. When the 128 word lines 221 are assumed to intersect, the sum of the currents, which leak out to those intersecting wirings, is 13 μA ("0") and 9 μA ("1"), depending on the data. Thus, the read current is reduced to 37 μA ("0") and 24 μA ("1"), depending on the data. Thus, as for the read current, the difference between 33 μA of the data "1" in the memory cell 222 in the vicinity of the word line 221 closest to the potential setting circuit 224 and 37 μA of the data "0" in the memory cell 222 in the vicinity of the word line 221 farthest to the potential setting circuit 224 is only 4 μA. In order to make the higher-capacity semiconductor storage device, the memory array 235 is required to be made larger. However, since the wiring length becomes long, the read current difference is further reduced, which makes the reading difficult.

Japanese Laid-Open Patent Application JP-P 2002-170377A (corresponding to U.S. Pat. No. 6,778,430B2) discloses a thin film magnetic storage device. This thin film magnetic storage device includes a memory array having a plurality of magnetic memory cells that are arranged in a matrix shape. Here, each of the plurality of magnetic memory cells includes a storage unit in which a resistance value is changed based on the level of a written storage data, when a data write magnetic field applied by first and second data write currents is larger than a predetermined magnetic field. This further includes a plurality of write word lines, which are installed correspondingly to the rows of the magnetic memory cells, respectively, and constituted by the wirings having a first resistivity. Here, each of the plurality of write word lines is selectively activated in accordance with the row selection result, in both cases of writing the data and reading the data. This further includes: a word line current control circuit for generating and shutting down the current route of the first data write current, respectively, in each of the cases of writing the data and reading the data, for at least one activated write word line among the plurality of write word lines; a plurality of data lines which are arranged correspondingly to the columns of the magnetic memory cells, respectively; a reading writing control circuit for supplying each of the second data write current and data read current to one data line corresponding to the column selected from the plurality of data lines, in each of the cases of writing the data and reading the data; and a plurality of read word lines which are arranged correspondingly to the rows of the magnetic memory cells, respectively, and constituted by the wirings having a second resistivity higher than the first resistivity. Each of the read word lines is selectively activated together with the write word line correspondingly to the row selection result, when the data is read.

Japanese Laid-Open Patent Application JP-P 2002-269968A (corresponding to U.S. Pat. No. 6,614,682B2) discloses an information reproducing method of a ferromagnetic memory. This ferromagnetic memory includes a plurality of units, each of which includes: variable resistors arranged in a matrix shape, a plurality of bit lines parallel to each other, and a plurality of sensing amplifiers connected to the bit lines. The variable resistor is composed of a hard layer that is made of ferromagnetic material and stores an information based on a magnetization direction, anon-magnetic layer, and a soft layer made of a ferromagnetic material whose magnetic coercive force is smaller than the hard layer. In order to parallel output a plurality of information at the same time, the plurality of sensing amplifiers in the unit is activated at the same time, the plurality of units are sequentially switched in synchronization with a clock pulse and the sensing amplifiers in the plurality of units are activated, the information are parallel outputted from the plurality of sensing amplifiers in the plurality of units in synchronization with the clock pulse. Thus, the information is continuously reproduced.

Japanese Laid-Open Patent Application JP-P 2003-7982A (corresponding to U.S. Pat. No. 6,683,802B2) discloses a magnetic storage device and a designing method of a magnetic storage device. This magnetic storage device includes a plurality of first wirings extended in a first direction; a plurality of second wirings extended in a second direction different from the first direction; and magnetic elements which are placed at the intersections between the first wirings and the second wirings and include at least ferromagnetic films whose magnetization directions are variable. In the magnetic storage device, the synthesis magnetic field generated by the currents that flow through the selected first wiring and second wiring is used to change the magnetization state of the predetermined magnetic element arranged at the intersection between the wirings and consequently write the information. In at least one combination of: a combination in which a distance between the first wiring and the predetermined magnetic element at the intersection to which the information is written is d, a magnitude ratio of the second direction component of the synthesis magnetic field in the adjacent magnetic element in the second direction to the predetermined magnetic field is γ, and an interval between the predetermined magnetic element and the adjacent magnetic element is p; and a combination in which a distance between the second wiring and the predetermined magnetic element at the intersection is d, a magnitude ratio of the first direction component of the synthesis magnetic field in the adjacent magnetic element in the first direction to the predetermined magnetic element is γ, and an interval between the predetermined magnetic element and the adjacent magnetic element is p, this is set such that the d satisfies the relation of $d \leq p \times (\gamma/(1-\gamma)) \cdot 1/2$ (here, $0<\gamma<1$).

Japanese Laid-Open Patent Application JP-P 2003-318370A (corresponding to U.S. Pat. No. 6,912,152B2) discloses a magnetic random access memory. This magnetic random access memory includes: a memory cell array having a plurality of memory cells in which a magnetic resistance effect is used; a first function line that is extended in a first direction inside the memory cell array and commonly connected to one ends of the plurality of memory cells; a plurality of second function lines that are arranged correspondingly to the plurality of memory cells and extended in a second direction intersecting the first direction inside the memory cell array; and a third function line that is separated from the plurality of memory cells and shared by the plurality of memory cells. In each of the plurality of memory cells, the other end is independently connected to one of the plurality of second function lines.

Japanese Laid-Open Patent Application JP-P 2004-206796A (corresponding to U.S. Pat. No. 6,961,261B2) discloses a magnetic random access memory and a data reading method of the magnetic random access memory. In this magnetic random access memory, one block is configured by a plurality of magnetoresistive-effect elements in which a magnetoresistive effect is used to store a data, and this block includes a plurality of memory cell arrays that are arranged in a row direction and a column direction. This includes: a plurality of first magnetoresistive-effect elements placed inside a first block; a plurality of first word lines that are respectively independently connected to one ends of the plurality of first magnetoresistive-effect elements and extended in the row direction; a first read sub bit line that is commonly connected to the other ends of the plurality of first magnetoresistive-effect elements; a first block selection switch in which one end of a current route is connected to the first read sub bit line; and a first read main bit line that is connected to the other end of the current route of the first block selection switch and extended in the column direction.

Japanese Laid-Open Patent Application JP-P 2004-213771A (corresponding to U.S. Pat. No. 6,862,210B2) discloses a magnetic random access memory. This magnetic random access memory includes a memory cell configured by a magnetoresistive element whose electric resistance value is changed by a magnetism; a sub bit line connected to one end of the memory cell; a main bit line connected through a first selecting circuit to the sub bit line; a sensing amplifier connected through a second selecting circuit to the main bit line; a wiring that is connected to the other end of the memory cell and arranged in a first direction; a first operation circuit connected through a third selecting circuit to one end of the wiring; a second operation circuit connected to the other end of the wiring; and a word line that passes above an intersection at which the memory cell and the wiring are connected and is arranged in a second direction orthogonal to the first direction. At a time of a reading operation for reading a data from the memory cell, the first operation circuit functions as a word line driver, and the wiring serves as the word line for reading. At a time of a writing operation for writing the data to the memory cell, the first and second operation circuits function as one of a bit line driver and a bit line sinker circuit, and the wiring serves as the bit line for writing.

Japanese Laid-Open Patent Application JP-P 2005-101535A (corresponding to U.S. Patent Application US2005045919A1) discloses a semiconductor device. This semiconductor device includes: first and second wiring layers different from each other; and a via connecting a wiring in the first wiring layer and a wiring in the second wiring layer and including a member whose conductivity is variable. The via functions as a switch element of a conductivity-variable type, in which a contact portion between the via and the first wiring is defined as a first terminal, and a contact portion between the via and the second wiring is defined as a second terminal. In the switch element, the connection state between the first terminal and the second terminal can be variably set to a shorted state, an opened state or a middle state between the shorted state and the opened state.

Japanese Laid-Open Patent Application JP-P 2005-182986A (corresponding to U.S. Pat. No. 6,980,465B2) discloses an address specifying circuit for a cross point memory array including a cross point resistance element. This address specifying circuit address-specifies a cross point memory array that has address lines of a first set and address lines of a second set. This includes: cross point resistance elements (114) of the first set connected to the address lines (116) of the first set; cross point resistance elements (114) of the second set connected to the address lines (126) of the second set; and at least one of a pull-up cross point resistance element (112) connected to the address line (116) of the first set and a pull-down cross point resistance element (122) connected to the address line (126) of the second set.

National publication of translated version JP-P 2005-522045A (international Publication WO03085675A2) discloses a phase-change memory device. This phase-change memory device includes: a substrate; a plurality of first wirings parallel to each other that are formed on the substrate; a plurality of second wirings parallel to each other that are formed on the substrate to intersect the first wirings while insulated from the first wirings; and memory cells which are arranged at respective intersections between the first wirings and the second wirings and in which one ends are connected to the first wirings and the other ends are connected to the second wirings. The memory cell includes: a variable resistance element for storing a resistance value, which is determined by a phase change between a crystal state and an amorphous state, as an information; and a Schottky diode connected in series to this variable resistance element.

DISCLOSURE OF INVENTION

An object of the present invention is to provide a semiconductor storage device in which a distinction property of each resistive storage element can be attained while a high integration is attained by using a switch element shared by a plurality of storage elements, and an operating method of the same.

Also, another object of the present invention is to provide a semiconductor storage device in which high speed reading, miniaturization and a high capacity can be attained while a high integration is attained by using a switch element shared by a plurality of storing elements, and an operating method of the same.

This and other objects, features and advantages of the present invention will be readily ascertained by referring to the following description and drawings.

A semiconductor storage device of the present invention includes a plurality of reading blocks, a plurality of third wirings, a plurality of first reading switches, a first control circuit, and a plurality of evaluating circuits. The plurality of reading blocks is collaterally arranged in a second direction. Here, each of the plurality of reading blocks includes: a plurality of first wirings extended in a first direction different from the second direction, a plurality of second wirings extended in the second direction, and a plurality of resistive storage elements arranged at respective points where the plurality of first wirings and the plurality of second wirings intersect and storing data based on variations of resistance values. Each of the plurality of resistive storage elements is connected to a corresponding first wiring among the plurality of first wirings at one end, and connected to a corresponding second wiring among the plurality of second wirings at the other end. The plurality of third wirings is extended in the second direction, and is provided correspondingly to the plurality of second wirings. The plurality of first reading switches is arranged between each of the plurality of third wirings and the corresponding second wiring among the plurality of second wirings in each of the plurality of reading blocks. The first control circuit controls to turn on and off the plurality of first reading switches and supplies a predetermined current or voltage to the plurality of first wirings. The plurality of evaluating circuits is connected to the plurality of third wirings and evaluates the currents or voltages. When data is read from each of the plurality of resistive storage elements, the first control circuit selects a selection reading block from the plurality of reading blocks by the plurality of first reading switches, selects a selection first wiring from the plurality of first wirings in the selection reading block and supplies the predetermined current or voltage. The plurality of evaluating circuits executes the evaluations of the currents or voltages in the plurality of third wirings.

In the semiconductor storage device, the plurality of reading blocks is collaterally installed in the first direction and the second direction. This further includes: a plurality of fourth wirings extended in the first direction and provided correspondingly to the plurality of first wirings; a plurality of second reading blocks arranged between each of the plurality of fourth wirings and the corresponding first wiring among the plurality of first wirings in each of the plurality of reading blocks; and a second control circuit controlling to turn on and off the plurality of second reading switches. When the reading operation of data from each of the plurality of resistive storage elements, the second control circuit controls the plurality of second reading switches and the first control circuit controls the plurality of first reading switches so that the selection reading block is selected from the plurality of reading blocks. The first control circuit selects a selection fourth wiring from the plurality of fourth wirings in the selection reading block so that the selection first wiring is selected and the predetermined current or voltage is supplied to the selection first wiring. The plurality of evaluating circuit executes the evaluations of the currents or voltages in the plurality of third wirings.

In the semiconductor storage device, the control circuit applies a predetermined current or voltage to the plurality of first wirings except the selection first wiring in the selection reading block, when the reading operation of the data.

The semiconductor storage device includes a non-linear resistance element in which the resistive storage element is built or to which the resistive storage element is connected.

In the semiconductor storage device, in the selection reading block in the reading operation of the data, one resistance value among a plurality of resistive storage elements of reading targets in the plurality of resistive storage elements is defined as Rja, resistance values of the resistive storage elements connected to the same second wiring among the plurality of resistive storage elements are defined as Rjb, resistance values of the resistive storage elements having the resistance values except Rja among the plurality of resistive storage elements of the reading targets are defined as Rjc, the resistance values of remaining resistive storage elements among the plurality of resistive storage elements are defined as Rjd, an on-resistance value of the first reading switch is defined as Rtr, and a potential applied to the first wiring from which the reading is not executed is defined as Vs1, and the sum of the resistance value of the first wiring from which the reading is not executed and the resistance value between the first wiring and a power source Vs1 is defined as Rin, a potential of the first wiring from which the reading is executed is defined as Vr, and a potential of the third wiring at the time of the reading operation is defined as Vs2, respectively. In the equivalent circuit in which the respective Rjb, Rjc and Rjd are assumed to have the same resistance values, when the maximum and minimum resistance values that Rjb, Rjc and Rjd can take are assumed to be Rjbmax, Rjcmax and Rjdmax, and Rjbmin, Rjcmin and Rjdmin, respectively, a function f=Ibit (Rjb, Rjc, Rjd)=f (Rja, m, n, Rin, Rtr, Vs1, Vs2, Rjb, Rjc, Rjd) to calculate a read current Ibit derived from the equivalent circuit is used and the resistance value of the resistive storage element of the reading target is Rja, the maximum value of Ibit is represented by Ibitmax (Rja)=MAX (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rbmin, Rjcmin, Rjdmax) and Ibit (Rjbmin, Rjcmin, Rjdmin)), and the minimum value is represented by Ibitmin (Rja)=MIN (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rjbmin, Rjcmin, Rjdmax), and Ibit (Rjbmin, Rjcmin, Rjdmin)). Here, MAX (a, b, c) is the function for indicating the maximum value among a, b and c, and MIN (a, b, c) is the function for indicating the minimum value among a, b and c. Rja has the p number of values of Rja1 to Rjap and when Rjag is a smaller value in adjacent two resistance values Rjag and Rjah, Ibitmin (Rjag)−Ibitmax (Rjah)>0 is established in all of the combinations of Rja1 to Rjap.

In the semiconductor storage device, the function f is represented by the following equation.

$$f(Rja,m,n,Rin,Rtr,Vs1,Vs2,Rjb,Rjc,Rjd)=(-B/Rjd+Rjd\cdot(m-1)\cdot D\cdot/Rt-Vs2\cdot(m-1)/Rtr-Vr/Rjc+Rjd\cdot D/Rjc+D)/(A/Rjd-Rjd\cdot(m-1)\cdot C/Rtr-Rjd\cdot C/Rc-C),$$

Here,
A=Rjb+Rtr+Rjb·Rtr/Rja,
B=Vs2−Rjb(Vr−Vs2)/Rja,
C=A·(n−1)/Rin−Rtr/Rjb+A/Rjb, and
D=B·(n−1)/Rin−Vs1·(n−1)/Rin−Vs2/Rjb+B/Rjb+B/Rjd.

In the semiconductor storage device, the plurality of resistive storage elements is the magnetoresistive elements.

The present invention is a reading method of a semiconductor storage device. Here, the semiconductor storage device includes a plurality of reading blocks, a plurality of third wirings, a plurality of first reading switches, a first control circuit, and a plurality of evaluating circuits. The plurality of reading blocks is collaterally arranged in a second direction. Here, each of the plurality of reading blocks includes: a plurality of first wirings extended in a first direction different from the second direction, a plurality of second wirings extended in the second direction, and a plurality of resistive storage elements arranged at respective points where the plurality of first wirings and the plurality of second wirings intersect and storing data based on variations of resistance values. Each of the plurality of resistive storage elements is connected to a corresponding first wiring among the plurality of first wirings at one end, and is connected to a corresponding second wiring among the plurality of second wirings at the other end. The plurality of third wirings is extended in the second direction, and provided correspondingly to the plurality of second wirings. The plurality of first reading switches is arranged between each of the plurality of third wirings and the corresponding second wiring among the plurality of second wirings in each of the plurality of reading blocks. The first control circuit controls to turn on and off the plurality of first reading switches and supplies a predetermined current or voltage to the plurality of first wirings. The plurality of evaluating circuits is connected to the plurality of third wirings and evaluates the currents or voltages.

The reading method of the semiconductor storage device includes: (a) the first control circuit selecting a selection reading block from the plurality of reading blocks by turning on the plurality of first reading switches; (b) the first control circuit selecting a selection first wiring from the plurality of first wirings in the selection reading block and supplying the predetermined current or voltage; and (c) the plurality of evaluating circuits executing the evaluations of the currents or voltages in the plurality of third wirings at the substantially same time.

In the reading method of the semiconductor storage device, in the semiconductor storage device, the plurality of reading blocks is collaterally installed in the first direction and the second direction. This further includes: a plurality of fourth wirings extended in the first direction and provided correspondingly to the plurality of first wirings, a plurality of second reading blocks arranged between each of the plurality of fourth wirings and the corresponding first wiring among the plurality of first wirings in each of the plurality of reading blocks, and a second control circuit controlling to turn on and off the plurality of second reading switches. In the reading method of the semiconductor storage device, the step (a) includes: the second control circuit turning on the plurality of second reading switches; and the first control circuit turning on the plurality of first reading switches so that the selection reading block is selected from the plurality of reading blocks. The step (b) includes: the first control circuit selecting the selection fourth wiring from the plurality of fourth wirings in the selection reading block so that the selection first wiring is selected and the predetermined current or voltage is supplied to the selection first wiring.

In the reading method of the semiconductor storage device, the step (b) includes the control circuit applying a predetermined current or voltage to the plurality of first wirings except the selection first wiring in the selection reading block.

In the reading method of the semiconductor storage device, in the selection reading block, one resistance value among a plurality of resistive storage elements of reading targets in the plurality of resistive storage elements is defined as Rja, resistance values of the resistive storage elements connected to the same second wiring among the plurality of resistive storage elements are defined as Rjb, resistance values of the resistive storage elements having the resistance values except Rja among the plurality of resistive storage elements of the reading targets are defined as Rjc, the resistance values of remaining resistive storage elements among the plurality of resistive storage elements are defined as Rjd, an on-resistance value of the first reading switch is defined as Rtr, and a potential applied to the first wiring from which the reading is not executed is defined as Vs1, and the sum of the resistance value of the first wiring from which the reading is not executed and the resistance value between the first wiring and a power source Vs1 is defined as Rin, a potential of the first wiring from which the reading is executed is defined as Vr, and a potential of the third wiring at the time of the reading operation is defined as Vs2, respectively. In the equivalent circuit in which the respective Rjb, Rjc and Rjd are assumed to have the same resistance values, when the maximum and minimum resistance values that Rjb, Rjc and Rjd can obtain are assumed to be Rjbmax, Rjcmax and Rjdmax, and Rjbmin, Rjcmin and Rjdmin, respectively. When a function f=Ibit (Rjb, Rjc, Rjd)= f (Rja, m, n, Rin, Rtr, Vs1, Vs2, Rjb, Rjc, Rjd) to calculate a read current Ibit derived from the equivalent circuit is used and the resistance value of the resistive storage element of the reading target is Rja, the maximum value of Ibit is represented by Ibitmax (Rja)=MAX (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rbmin, Rjcmin, Rjdmax) and Ibit (Rjbmin, Rjcmin, Rjdmin)), and the minimum value is represented by Ibitmin (Rja)=MIN (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rjbmin, Rjcmin, Rjdmax), and Ibit (Rjbmin, Rjcmin, Rjdmin)). Here, MAX (a, b, c) is the function for indicating the maximum value among a, b and c, and MIN (a, b, c) is the function for indicating the minimum value among a, b and c. Rja has the p number of values of Rja1 to Rjap and when Rjag is a smaller value in adjacent two resistance values Rjag and Rjah, Ibitmin (Rjag)−Ibitmax (Rjah)>0 is established in all of the combinations of Rja1 to Rjap.

In the reading method of the semiconductor storage device, the function f is represented by the following equation.

$$f(Rja,m,n,Rin,Rtr,Vs1,Vs2,Rjb,Rjc,Rjd)=(-B/Rjd+Rjd\cdot(m-1)\cdot D\cdot/Rt-Vs2\cdot(m-1)/\cdot Rtr-Vr/Rjc+Rjd\cdot D/Rjc+D)/(A/Rjd-Rjd\cdot(m-1)\cdot C/Rtr-Rjd\cdot C/Rc-C);$$

Here,
A=Rjb+Rtr+Rjb·Rtr/Rja;
B=Vs2−Rjb(Vr−Vs2)/Rja;
C=A·(n−1)/Rin−Rtr/Rjb+A/Rjb
D=B·(n−1)/Rin−Vs1·(n−1)/Rin−Vs2/Rjb+B/Rjb+B/Rjd.

BRIEF DESCRIPTION OF THE DRAWINGS

FIG. 9 is a table showing a relation between a minimum difference of Ibit, (n−1) and (Rtr/Rj).

FIG. 10 is a table showing a relation between the minimum difference of Ibit and (n−1) and (Rtr/Rj).

FIG. 12 is a table showing a relation between the minimum difference of Ibit and (n−1) and (Rtr/Rj).

FIG. 15 is a table showing a relation between the minimum difference of Ibit and (n−1) and (Rtr/Rj).

FIG. 16 is a table showing a relation between the minimum difference of Ibit and (n−1) and (Rtr/Rj).

BEST MODE FOR CARRYING OUT THE INVENTION

Exemplary embodiments of the semiconductor storage device of the present invention and the operating method of the same will be described below with reference to the attached drawings.

First Exemplary Embodiment

The first exemplary embodiment of the semiconductor storage device of the present invention will be described below with reference to the attached drawings.

Figure 1:
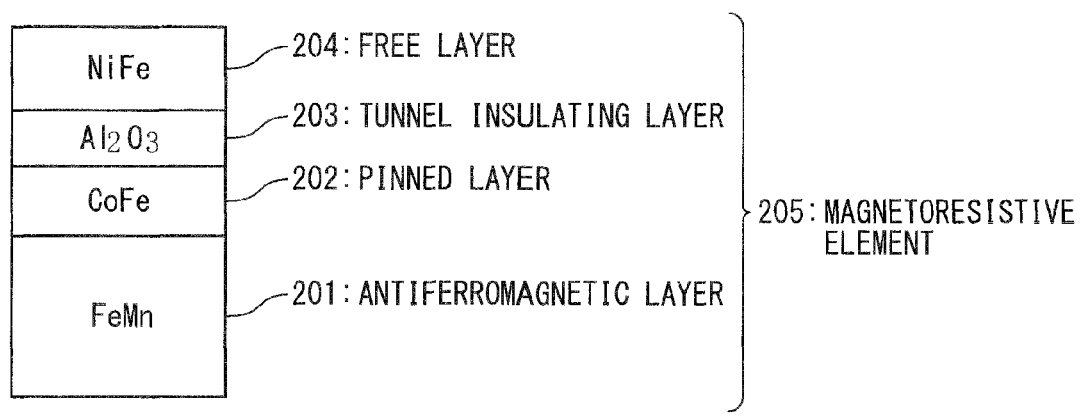
FIG. 1 is a sectional view showing one example of the conventional TMR element.
Figure 2:
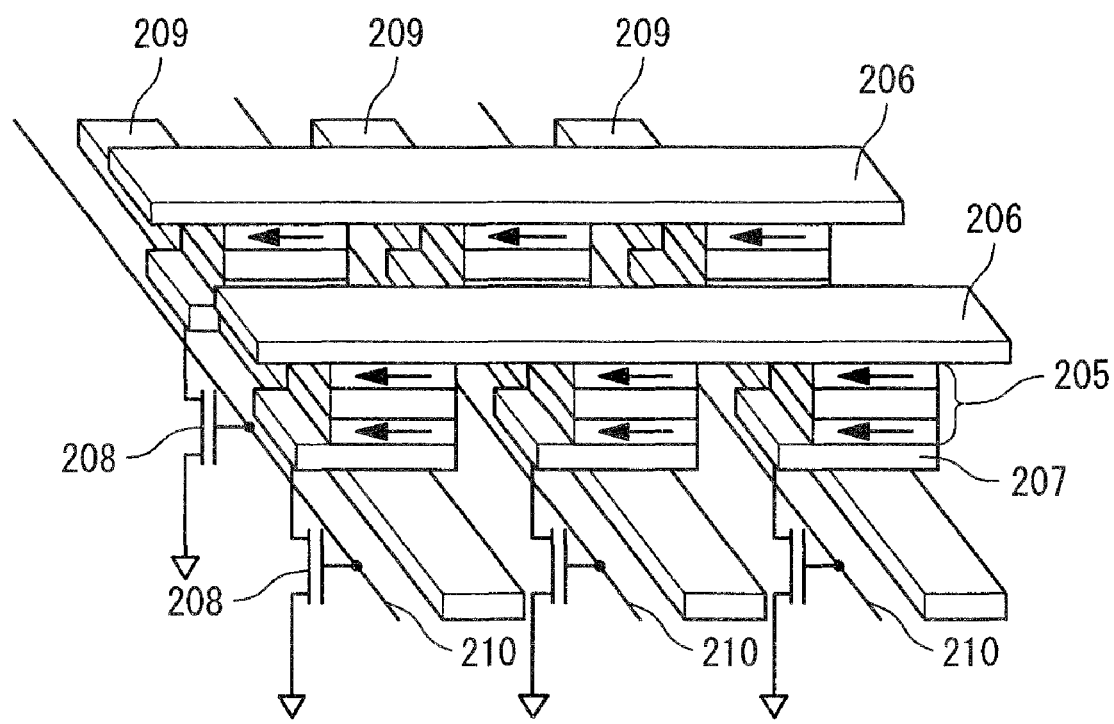
FIG. 2 is a perspective view showing one example of the conventional semiconductor storage device.
Figure 3:
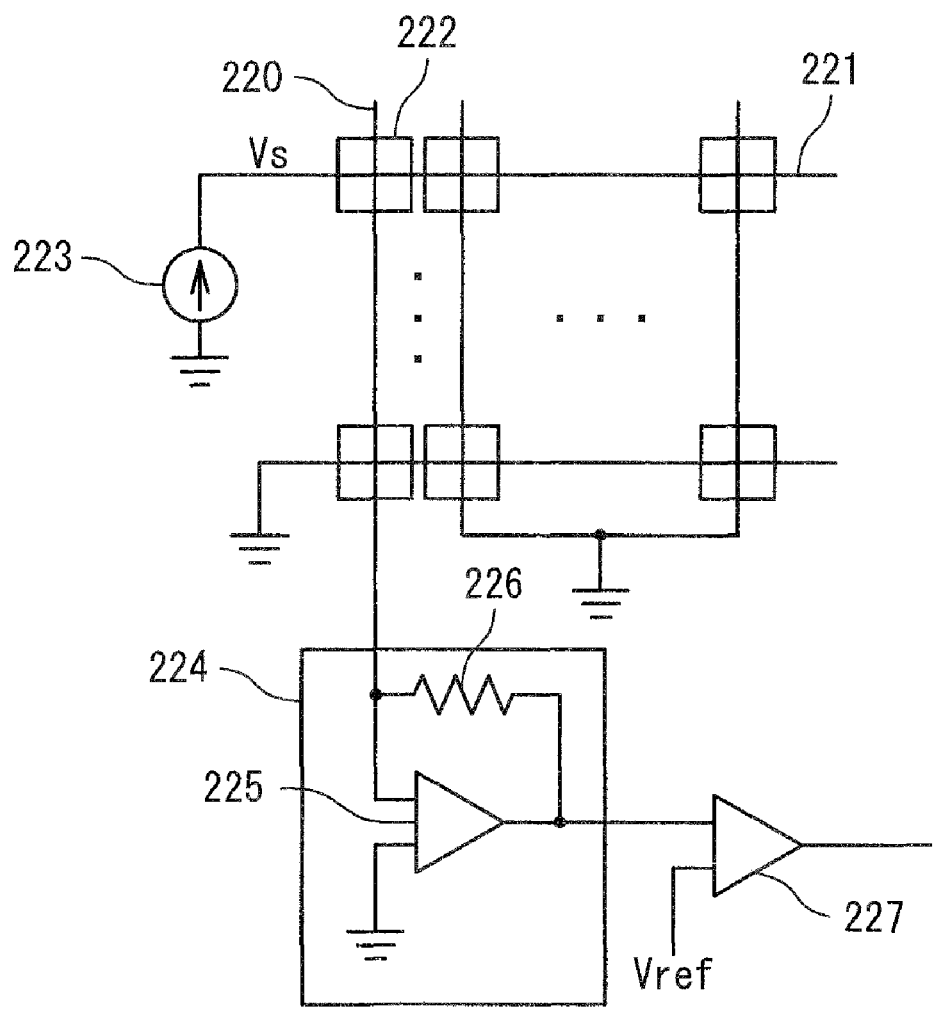
FIG. 3 is a schematic block diagram describing the conventional equivalent potential reading method.
Figure 4:
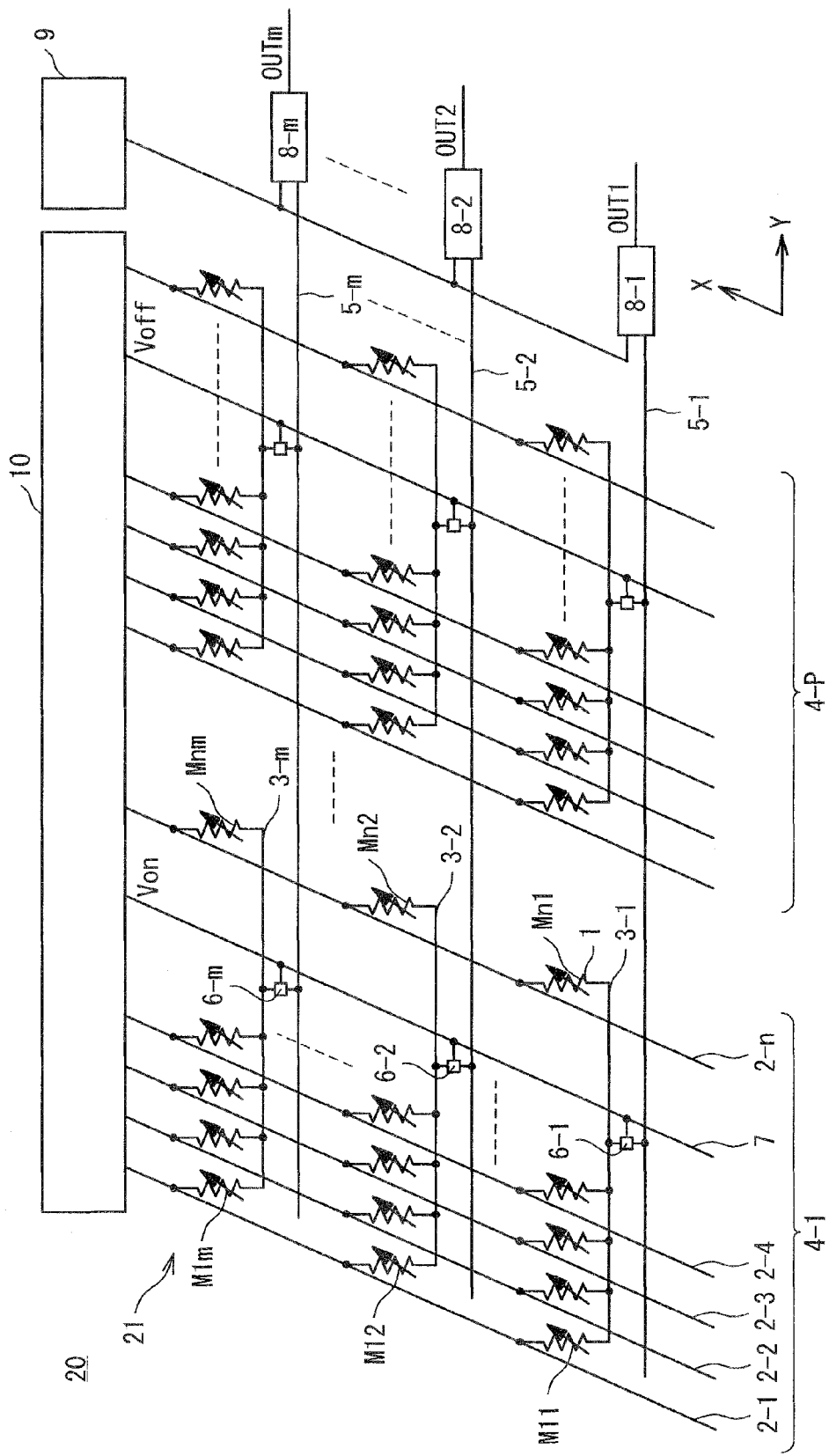
FIG. 4 is a block diagram showing a configuration of a first exemplary embodiment of a semiconductor storage device of the present invention.

FIG. 4 is a block diagram showing a configuration of the first exemplary embodiment of the semiconductor storage device of the present invention. A semiconductor storage device 20 includes a resistive storage element array 21, a plurality of evaluating circuits 8-1 to 8-$m$ (hereafter, m is a natural number), an evaluation control circuit 9 and a reading control circuit 10.

The resistive storage element array 21 includes a plurality of unit blocks 4-1 to 4-$p$ (hereafter, p is a natural number). Each of the plurality of unit blocks 4-1 to 4-$p$ includes a plurality of memory cells M11 to Mnm (hereafter, n is a natural number), a plurality of word lines 2-1 to 2-$n$, a plurality of bit lines 5-1 to 5-$m$, a plurality of assistant bit lines 3-1 to 3-$m$, a plurality of switch elements 6-1 to 6-$m$, and a switch element control line 7.

The plurality of memory cells M11 to Mnm is arrayed in a matrix shape. Each of the plurality of memory cells M11 to Mnm includes a resistive storage element 1, which stores data based on a resistance state and has at least two terminals. The resistive storage element 1 in the memory cell Mij ($1 \leq I \leq n$, $1 \leq j \leq m$) is connected to the word line 2-$i$ at one end, and connected to the assistant bit line 3-$j$ at the other end, respectively. The resistive storage element 1 is exemplified as the magnetoresistive element or the phase-change resistive element.

The plurality of word lines 2-1 to 2-$n$ is connected to the reading control circuit 10 at one end and extended in an X-direction. The word line 2-$i$ is connected to one end of the resistive storage element 1 in the memory cells Mi1 to Mim. The plurality of assistant bit lines 3-1 to 3-$m$ is extended in a Y-direction that is substantially vertical to the X-direction. The assistant bit line 3-$j$ is connected to the other end of the resistive storage element 1 in the memory cells M1$j$ to Mm$j$. The switch element 6-$j$ is connected to the assistant bit line 3-$j$ at one end, connected to the bit line 5-$j$ at the other end, and connected to the switch element control line 7 at the terminal to control the switch operation, respectively. The switch element control line 7 is connected to the reading control circuit 10 at one end and extended in the X-direction. The switch element control line 7 is connected to the terminal to control the switch operation in each of the switch elements 6-1 to 6-$m$. Each of the switch elements 6-1 to 6-$m$ is turned on and off based on the potential of the switch element control line 7 and operated for each unit block 4-$k$ ($1 \leq k \leq p$). Since the switch elements 6-1 to 6-$m$ are turned on based on the potential of the switch element control line 7, the unit block 4-$k$ to which the switch elements 6-1 to 6-$m$ belong is selected. The plurality of bit lines 5-1 to 5-$m$ is extended in the Y-direction that is substantially vertical to the X-direction. The bit line 5-$j$ is connected to the evaluating circuit 8-$j$ at one end. Also, the bit line 5-$j$ is connected to the other end of the switch element 6-$j$ in each of the plurality of unit blocks 4-1 to 4-$p$, respectively.

The evaluating circuit 8-$j$ is connected to the bit line 5-$j$ and the evaluation control circuit 9. Based on a control signal from the evaluation control circuit 9, the potential of the bit line 5-$j$ or the current flowing through the bit line 5-$j$ is evaluated. When the data are read from all of the memory cells Mi1 to Mim along the word line 2-$i$ in the unit block 4-$k$ of the reading target, in order to evaluate the potentials or currents of all of the bit lines 5-1 to 5-$m$ connected to the memory cells Mi1 to Mim, the evaluation control circuit 9 makes the evaluating circuits 8-1 to 8-$m$ operate at the substantially same time. The reading control circuit 10 selects the word line 2-$i$ corresponding to the memory cells Mi1 to Mim of the reading targets, from the plurality of word lines 2-1 to 2-$n$. The reading control circuit 10 has a potential setting function or current applying function and applies the potential through the word line 2-$i$ to the resistive storage elements 1 in memory cells Mi1 to Mim. Also, the reading control circuit 10 makes the switch elements 6-1 to 6-$m$ to be turned on based on the potential of the switch element control line 7 in the unit block 4-$k$ of the reading target. Moreover, the reading control circuit 10 has a function for applying a predetermined potential to the word line 2 from which the reading is not executed, or a function for floating to the word line 2 from which the reading is not executed. At this time, the resistance value of the switch element 6, the resistance value of the resistive storage element 1 and the resistance value of the word line 2 including the switch resistance vale inside the reading control circuit 10 have the relation which will be described later.

Next, the exemplary embodiment of an operation of the semiconductor storage device in the present invention will be described below. At first, a reading operation will be described. Here, as an example, a case of reading the resistive storage elements 1 in the memory cells M31 to M3$m$ in the unit block 4-1 in FIG. 4 will be described.

At first, by the reading control circuit 10, the switch elements 6-1 to 6-$m$ in the unit block 4-1 of the reading target are turned on, and the switch elements 6-1 to 6-$m$ in the unit block 4-$kx$ ($kx \neq 1$) that is not the reading target are turned off. Next, by the reading control circuit 10, a potential difference is generated between the word line 2-3 of the reading target in the unit block 4-1 and the bit lines 5-1 to 5-$m$. For example, a potential is applied or a current is supplied to the word line 2-3. The word lines 2-$ix$ ($ix \neq 3$) that are not the reading target in the unit block 4-1 are set at a predetermined potential or set at an opened state by the reading control circuit 10. The word lines 2-1 to 2-$n$ in the unit block 4-$kx$ are set at the predetermined potential or set at the opened state by the reading control circuit 10. Next, the evaluating circuits 8-1 to 8-$m$ connected to all of the bit lines 5-1 to 5-$m$ connected to the unit block 4-1 are operated at the substantially same time by the evaluation control circuit 9. Thus, the evaluating circuits 8-1 to 8-$m$ evaluate the potentials or currents of the bit lines 5-1 to 5-$m$ and consequently evaluate the resistance values of the resistive storage elements 1 in the memory cells M31 to M3$m$ and judge the data. The evaluating circuits 8-1 to 8-$m$ output the judged data as read data OUT1 to OUTm.

The writing operation of the data can be carried out by supplying write currents to the word line 2-$i$ and the bit line 5-$j$, respectively, which correspond to the memory cell Mij to which the data is written. This is carried out by, for example, using the means for changing the resistance state of each resistive storage element that is separately provided.

Figure 5:
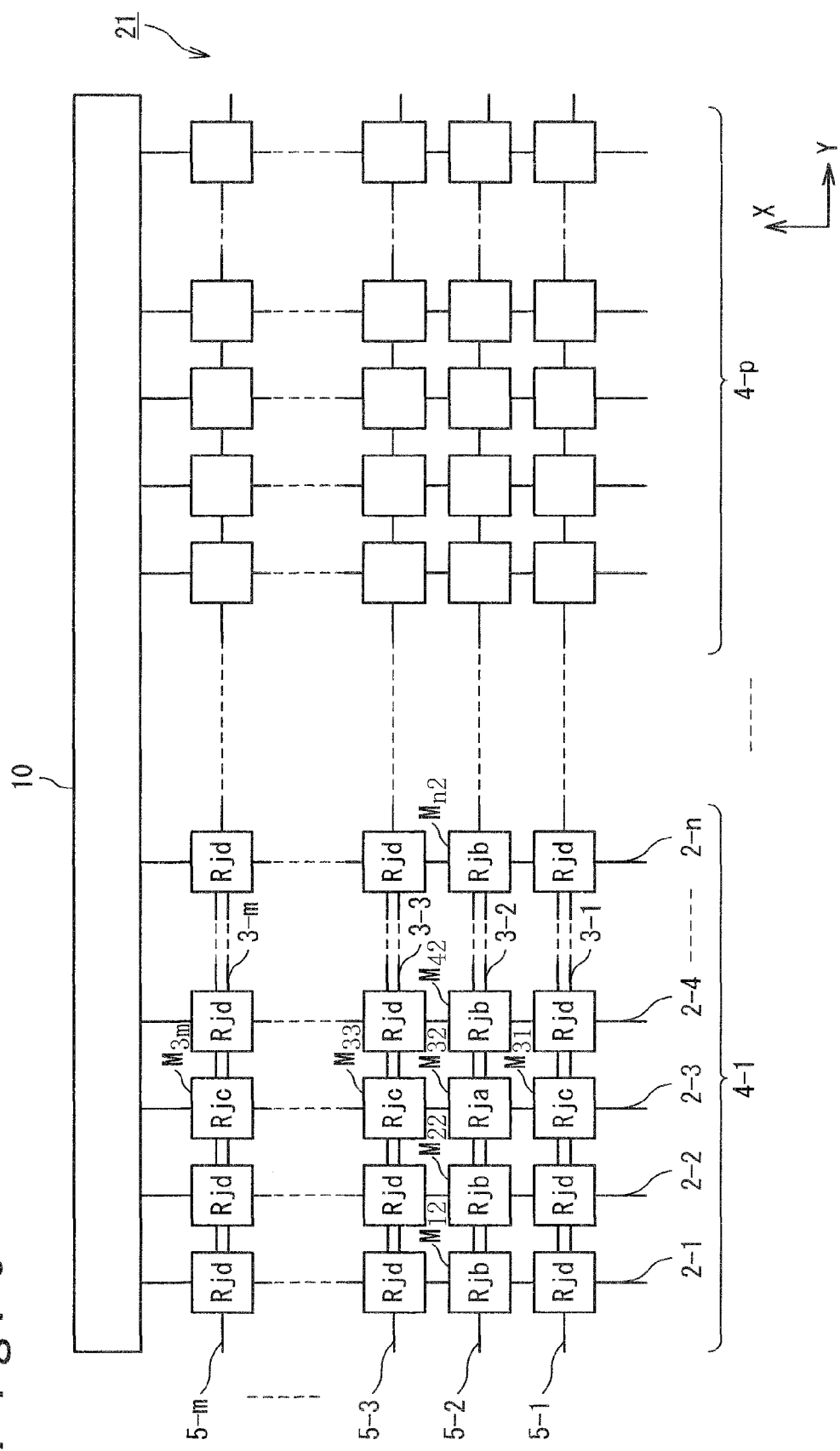
FIG. 5 is a schematic view schematically showing a configuration of a resistive storage element array 21 in FIG. 4.

FIG. 5 is the schematic view schematically showing the configuration of the resistive storage element array 21 in FIG.

4. Here, the resistance value of the resistive storage element 1 in one memory cell (ex.: M32) in the memory cells (ex.: M31 to M3m) of the reading targets is defined as Rja, the resistance values of the resistive storage elements 1 in the memory cells (ex.: M12 to Mn2, however ≠M32) connected to the same assistant bit line (ex.: 3-2) that are arranged in the same unit block (ex.: 4-1) are defied as Rjb, the resistance values of the resistive storage elements 1 in the remaining memory cells (ex.: M31 to M3m≠M32) of the reading targets are defined as Rjc, and the resistance values of the other resistive storage elements 1 inside the same unit block (ex.: 4-1) are defined as Rjd.

Figure 6:
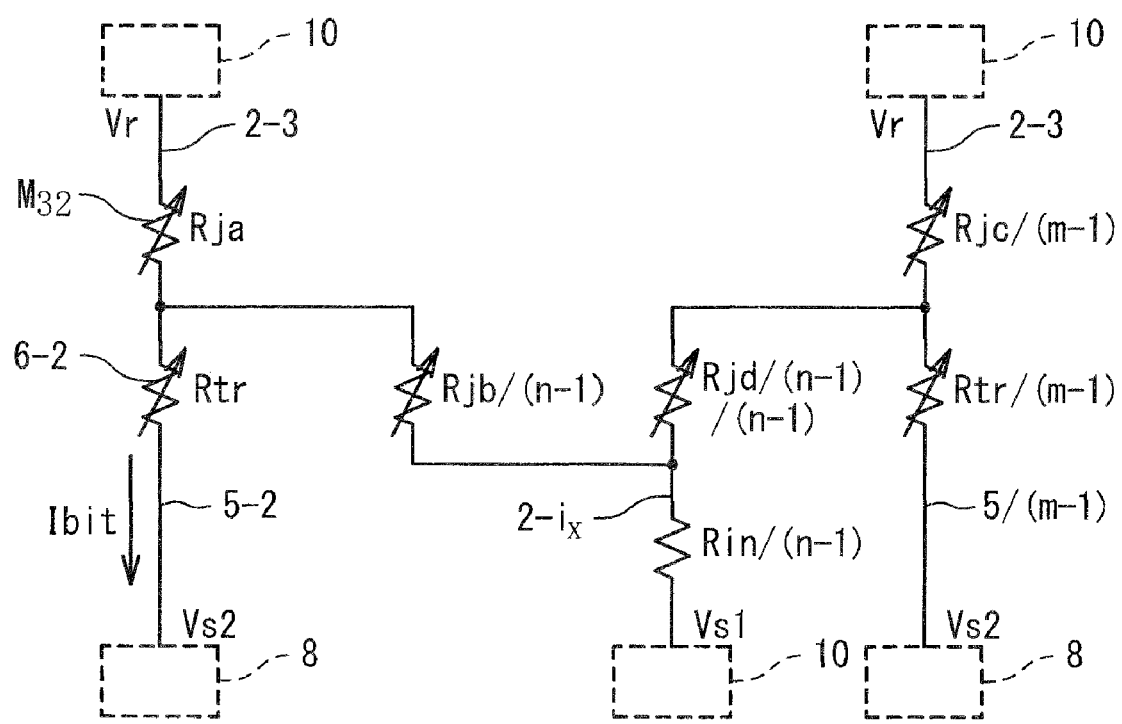
FIG. 6 is a circuit diagram showing an equivalent circuit at a time of a reading operation in the resistive storage element array 21.

FIG. 6 is a circuit diagram showing the equivalent circuit at the time of the reading operation in the resistive storage element array 21. The resistance value Rja, the resistance value Rjb, the resistance value Rjc and the resistance value Rjd are as described in FIG. 5. Also, the on-resistance value of the switch element (ex. 6-2) is defined as Rtr, the sum of the resistance value of the word line (ex.: 2-ix) that is not the reading target and the resistance value between the word line and the power source Vs1 inside the reading control circuit 10 is defined as Rin, the potential of the word line (ex.: 2-3) of the reading target is defined as Vr, and the potentials of the bit lines 5-1 to 5-m are defined as Vs2. The resistive storage element 1 has a plurality of resistance values (ex.: the two values of a high resistance and a low resistance in the case of the TMR element) depending on the data. Although Rjb, Rjc and Rjd include values of the plurality of resistive storage elements, here, they are assumed to be the same resistance value. The equivalent circuit in this case is as shown in FIG. 6. Here, "/(m−1)" indicates that the number of them is (m−1), and "/(n−1)" indicates that the number of them is (n−1), and "/(n−1)/(m−1)" indicates that the number of them is (n−1)×(m−1). When the word line (ex.: 2-ix) that is not the reading target at the time of the reading operation is set at the floating, the terminal of the power source Vs1 becomes in the opened state. However, even if Rin is considered to have the very large value, the similar result is obtained.

When each of Rjb, Rjc and Rjd is assumed to have one of the maximum value and the minimum value that can be obtained as each of them, respective 8 sets can be considered for one set of the resistance values (ex.: the maximum value and the minimum value) that can be obtained as Rja. That is, for Rja (the maximum value), there are the 8 sets of combinations of Rjb, Rjc and Rjd. Also, for Rja (the minimum value), there are the 8 sets of combinations of Rjb, Rjc and Rjd. Accordingly, the current values (first Ibit group) of the 8 sets for Rja (the maximum value) can be obtained as the current Ibit flowing through the bit line (ex.: 2-3), and the current values (second Ibit group) of the 8 styles for Rja (the minimum value) can be obtained as the current Ibit flowing through the bit line (ex.: 2-3). At this time, the condition that the first Ibit group and second Ibit group of which Rja are different from each other do not overlap is a requirement to normally judge the data. The resistance values Rja, Rjb, Rjc and Rjd that can be obtained from the data of the resistive storage element 1 and the values m, n, Rin, Rtr, Vs1 and Vs2 are defined as the combinations that satisfy this condition. This is referred to as a first condition.

The maximum resistance values that can be obtained as Rjb, Rjc and Rjd are assumed to be Rjbmax, Rjcmax ad Rjdmax, and the minimum resistance values that can be obtained as Rjb, Rjc and Rjd are assumed to be Rjbmin, Rjcmin and Rjdmin. From FIG. 6, a function f to calculate Ibit that leads to Ibit (Rjb, Rjc, Rjd)=f(Rja, m, n, Rin, Rtr, Vs1, Vs2, Rjb, Rjc, Rjd) can be derived from a following equation (1).

$$f(Rja,Rjb,Rjc,Rjd)=(-B/Rjd+Rjd\cdot(m-1)\cdot D\cdot/Rtr-Vs2\cdot(m-1)/Rtr-Vr/Rjc+Rjd\cdot D/Rjc+D)/(A/Rjd-Rjd\cdot(m-1)\cdot C/Rtr-Rjd\cdot C/Rc-C) \quad (1)$$

$A=Rjb+Rtr+Rjb\cdot Rtr/Rja$
$B=Vs2-Rjb\cdot(Vr-Vs2)/Rja$
$C=A\,(n-1)/Rin-Rtr/Rjb+A/Rjb$
$D=B\,(n-1)/Rin-Vs1\,(n-1)/Rin-Vs2/Rjb+B/Rjb+B/Rjd.$ When the resistive storage element from which the reading is executed has a certain resistance value Rja, the maximum value Ibitmax (Rja) and minimum value Ibitmin (Rja) of Ibit are represented as follows.

Ibitmax (Rja)=MAX (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rbmin, Rjcmin, Rjdmax) and Ibit (Rjbmin, Rjcmin, Rjdmin).

Ibitmin (Rja)=MIN (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rjbmin, Rjcmin, Rjdmax), and Ibit (Rjbmin, Rjcmin, Rjdmin)).

Here, MAX (a, b, c) is the function for indicating the maximum value among a, b and c, and MIN (a, b, c) is the function for indicating the minimum value among a, b and c.

When Rja has the q number of values of Rja1 to Rjaq (hereafter, q is a natural number) and Rjag is the smaller value in the adjacent two resistance values of Rjag and Rjah ($1 \leq g$, $g+1=h \leq q$), this exemplary embodiment is designed such that Ibitmin (Rjag)−Ibitmax (Rjah)>0 is satisfied in all of the combinations of Rja1 to Rjaq. That is, this is designed such that the minimum difference of Ibit is larger than 0. Actually, the resistance value of the resistive storage element has a variation. Thus, the current difference based on the data is required to be obtained under this consideration. When the resistive storage element is connected in series to a non-linear resistor, the calculation is carried out by considering its property.

According to the semiconductor storage device of the present invention, since the plurality of data can be read out at the same time, it is possible to attain the high speed operation. Also, since the switch element can be shared in the plurality of storing elements, it is possible to attain the higher integration and the larger capacity.

First Example

Figure 7:
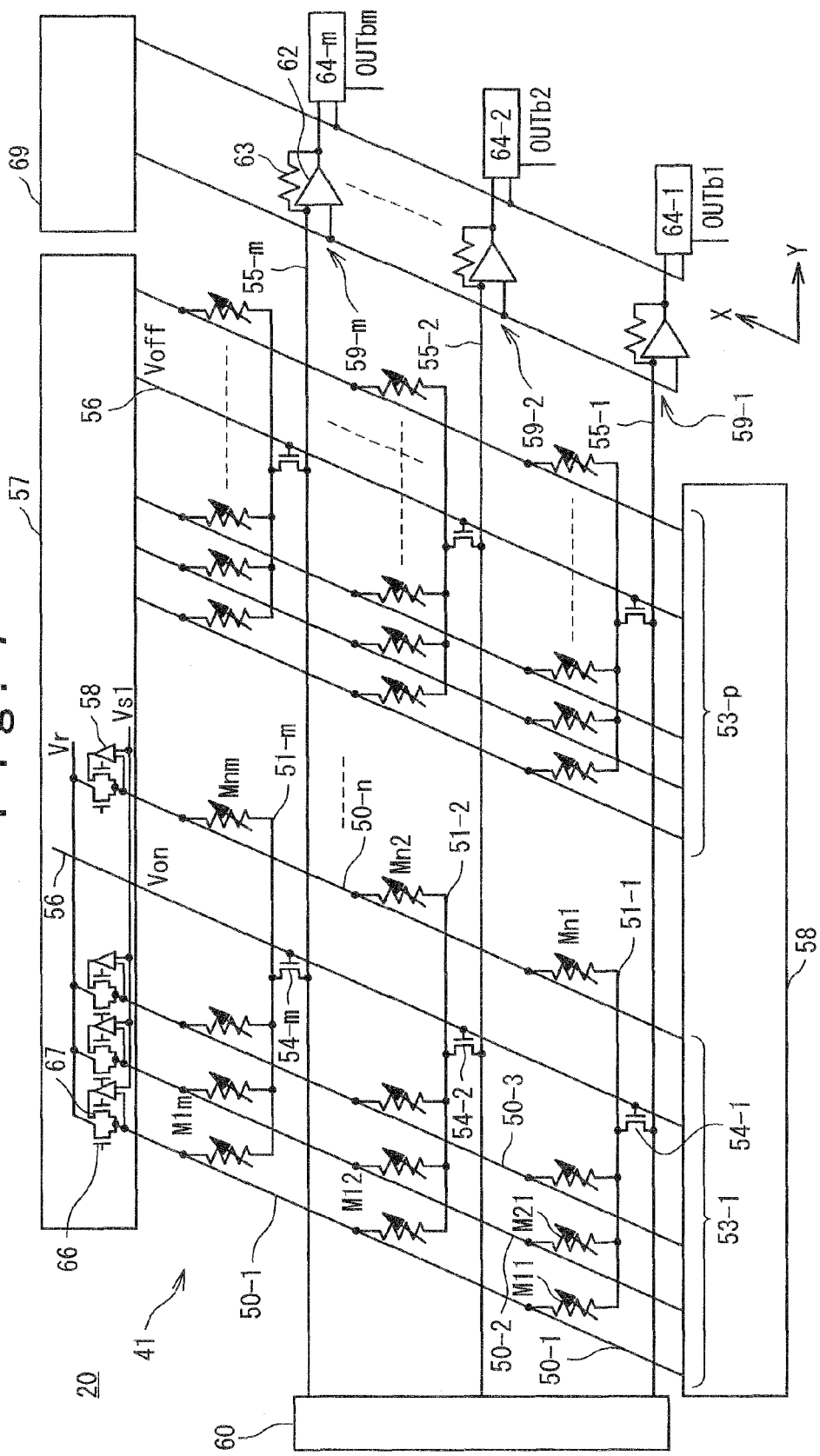
FIG. 7 is a schematic configuration view showing first and second examples of a semiconductor device of the present invention.
Figure 8:
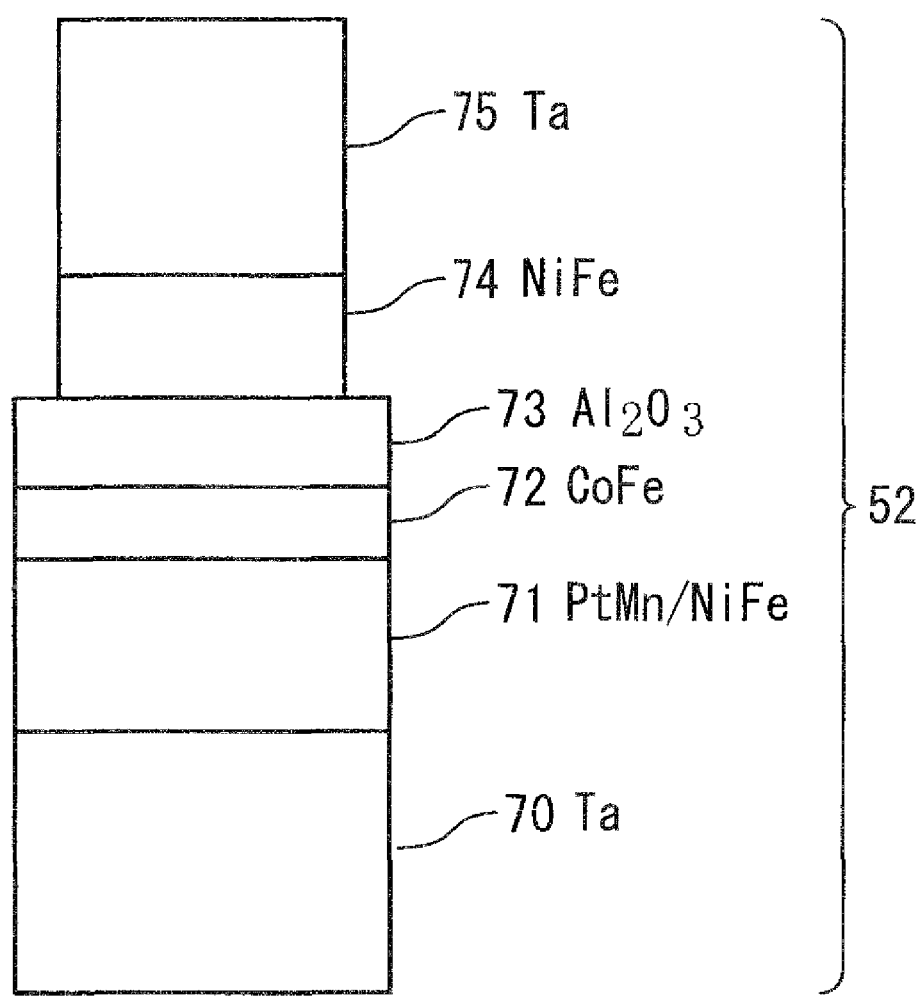
FIG. 8 is a main sectional view of a TMR element in FIG. 7.

The exemplary embodiment of the present invention will be described below using an specific example. FIG. 7 is a schematic configuration view showing a first example of the semiconductor device of the present invention. FIG. 8 is a main sectional view of a TMR element 52 in FIG. 7. A semiconductor storage device 40 includes a resistive storage element array 41, a plurality of sensing amplifiers 64-1 to 64-m, an evaluation control circuit 69, a word line control circuit 57, a word line termination circuit 58, a bit line termination circuit 60, and a plurality of potential setting circuits 59.

The resistive storage element array 41, unit blocks 53-1 to 53-p, memory cells M11 to Mnm, the TMR element 52, a plurality of word lines 50-1 to 50-n, a plurality of bit lines 55-1 to 55-m, a plurality of assistant bit lines 51-1 to 51-m, a plurality of reading transistors 54-1 to 54-m, a block selection line 56, and sensing circuits 64-1 to 64-m correspond to the resistive storage element array 21, the unit blocks 4-1 to 4-p, the memory cells M11 to Mnm, the resistive storage element 1, the plurality of word lines 2-1 to 2-n, the plurality of bit lines 5-1 to 5-m, the plurality of assistant bit lines 3-1 to 3-m, the plurality of switch elements 6-1 to 6-m, the switch element control line 7, and the evaluating circuits 8-1 to 8-m, respectively, in FIG. 7. They carry out the similar operations.

The potential setting circuit 59-j is connected to the bit line 5-j and a set potential applying line 61 at an input side, and connected to the sensing circuit 64-j at an output side, respectively. In response to an input of a potential Vs2 from the set potential applying line 61, the potential of the bit line 5-j is set at Vs2. Then, the current flowing through the bit line 5-j is outputted to the sensing circuit 64-j. The potential setting circuit 59-j is composed of a differential amplifier 62 and a feedback resistor 63. One input of the differential amplifier 62 is set to the potential Vs2 of the set potential applying line 61, and the bit line 5-j is connected to the other input. Moreover, the output of the differential amplifier 62 is set to the value in which the potential of the bit line 5-j connected through the feedback resistor 63 is the potential Vs2.

The word line control circuit 57 corresponds to the reading control circuit 10 and executes the similar operations. The word line 50-i of the reading target is set at a reading voltage Vr, and the word line 50-ix that is not the reading target is set at the potential Vs1. This is composed of transistors 66, 67 and a differential amplifier 68. As for the word line 50-ix that is not the reading target, one input of the differential amplifier 68 is set at the potential Vs1, and the word line 50-ix is connected to the other input. Moreover, the output of the differential amplifier 62 is connected to the word line 50-ix by turning on the transistor 67. On the other hand, as for the word line 50-i of the reading target, the transistor 66 is turned on, and the reading voltage Vr is applied to the word line 50-i. Also, in the unit block 53-k of the reading target, a reading block selection line 56 is set at the high potential, and the transistors 6-1 to 6-m are turned on.

The evaluation control circuit 69 corresponds to the evaluation control circuit 9 and executes the similar operations. The control signal to start a process for executing a judgment and outputting the data is supplied to a reading start line 65, and the sensing circuit 64-j is operated. In addition, the set potential applying line 61 is set at the potential Vs2.

The word line termination circuit 58 terminates the other ends of the plurality of word lines 50-1 to 50-n and the other end of the reading block selection line 56. The bit line termination circuit 60 terminates the other ends of the plurality of bit lines 55-1 to 55-m.

Each unit block 53 is provided with the 64 number (n=64) of word lines 50 and the 128 number (m=128) of assistant bit lines 51. Then, the 32 number (p=32) of unit blocks 53 are connected through the common main bit lines 55 (55-1 to 55-128) and thus, the memory array 41 of 256 kbits is configured. When the layout of those 16 number of memory arrays is prepared, the 4 Mbit-memory can be configured.

The TMR element (magnetoresistive element) 52 has a structure that a lower wiring layer 70 (Ta: 10 nm), an anti-ferromagnetic layer 71 (PtMn/NiFe: 10 nm), a pinned layer 72 (CoFe: 2.4 nm), a tunnel insulating layer 73 ($Al_2O_3$: 2 nm), a free layer 74 (NiFe: 5 nm) and an upper wiring layer 75 (Ta: 10 nm) are laminated in this order.

The operating method of the semiconductor storage device 40 will be described below exemplifying a case of using the unit block 53-1 as a writing/reading target.

The writing operation of the memory array 41 will be described below by exemplifying a case of executing the writing to the memory cell M31. At first, the word line control circuit 57 turns off all of the reading transistors 54-1 to 54-m, through the block selection lines 56-1 to 56-p, in the unit blocks 53-1 to 53-p. Next, the word line control circuit 57 supplies a potential to the word line 50-3 in the memory cell M31, to which the writing is executed, in the unit block 53-1, and the word line termination circuit 58 grounds the opposite end. Thus, a word line write current IWL, for example, 3 mA flows between both of them. Also, the bit line termination circuit 60 supplies a potential of about 0.2 V to the bit line 55-1, and the evaluation control circuit 69 sets the potential Vs2, which differs from this, for the set potential of the potential setting circuit 59-1. Thus, a bit line write current IBL having both of the polarities, for example, ±4 mA flows through the bit line 55-1. With the synthesis magnetic field generated by those write currents, it is possible to set the direction of the magnetization of the free layer in the TMR element 52. Hence, it is possible to change the TMR resistance value and execute the writing.

The reading operation will be described below exemplifying a case of reading from the memory cells M31 to M3m. The word line control circuit 57 activates one block selection line 56-1 inside the memory array 41 and turns on all of the reading transistors 54-1 to 54-m connected to the assistant bit lines 51-1 to 51-m inside the unit block 53-1. Thus, the assistant bit line 51 and the corresponding bit line 55 are connected. Next, the word line control circuit 57 turns on the transistor 66 for connecting the word line 50-3, from which the reading is executed, and the wiring to which the reading voltage Vr is applied. As for the other word line 50-ix, the transistor 67 for connecting the output of the differential amplifier 68 to which the potential Vs1 and the potential of the word line 50-ix are supplied is turned on and set at potential Vs1. When the evaluation control circuit 69 sets the input voltages Vs2 of the potential setting circuits 59-1 to 59-m to the zero potential, the reading current flows through the TMR element 52 connected to the word line 50-3, from which the reading is executed, to the other TMR element 52 connected to the same assistant bit line 51-j and the bit line 55-j. For example, with regard to the memory cell M31, the reading current flows from the word line 50-3 to the TMR element 52 of the memory cell M31, then, to the assistant bit line 51-1, after that, to the bit line 55-1, and finally, to the sensing circuit 64-1. In addition, the reading current flows from the word line 50-3 to the TMR element 52 of the memory cell M31, then, to the assistant bit line 51-1, after that, to the TMR elements 52 of the memory cells M11 to Mn1 (except the memory cell M31), and finally, to the word lines 50-1 to 50-n (except 50-3). After that, after the elapse of a desirable time, for example, 10 ns, the evaluation control circuit 69 activates the sensing circuits 64-1 to 64-m based on the control signal of a reading start line 65 and instructs the execution of a judging process. The sensing circuits 64 outputs data OUTb1 to OUTbm of all bits (the TMR elements 52) on the word line 50-3 from which the reading is executed.

FIG. 9 is a table showing a relation between the minimum difference of Ibit and (n−1) and (Rtr/Rj). This table shows the result in which the relation among the minimum difference of Ibit based on the TMR resistor, (n−1) and (Rtr/Rj) is calculated when the TMR resistance value Rj of each TMR element 52 has 1 kΩ and 1.5 kΩ based on the data, the on-resistance value of the reading transistor 54 is 100Ω, Vr is given such that the voltage applied to the memory cell from which the reading is executed is 1 V, and Vs1 is 0 V, and Vs2 is 0V. The fact that this minimum difference is positive is the requirement to normally execute the reading. Incidentally, this minimum difference is not based on m. In this example, on the word line 50-ix that is not the reading target, the constant voltage Vs1 is supplied by a feedback circuit. Thus, the transistor resistance value in the word line control circuit 57 can be ignored. In FIG. 9, the Ibit minimum difference does not become negative. However, as (n−1) is smaller and especially as (Rtr/Rj) is smaller, the Ibit minimum difference becomes larger, and the data judgment is known to be easier. In the case of this example ((n−1)=63, (Rtr/Rj)=0.1), the Ibit difference of 9 μA is obtained as shown in FIG. 9.

FIG. 10 is a table showing a relation between the minimum difference of Ibit, (n−1) and (Rtr/Rj). Here, as compared with the case of FIG. 9, this case differs in the Vs1 of 0.07 V. In this case, there are conditions that the data judgment is impossible because the minimum difference is negative. However, the Ibit minimum difference under the condition that (Rtr/Rj) is 0.1 is improved. In the case of this example ((n−1)=63, (Rtr/Rj)=0.1), the Ibit difference of 45 μA can be obtained as shown in the drawing. The optimal Vs1 obeys the other condition.

In this example, the TMR elements 52 are drawn on the same flat surface. However, if the electric connections are equivalent, the TMR elements 52 may be formed in the arrangement in which they are overlapped in different layers. In a case that the TMR element 52 is a toggle type, the writing is executed by controlling of the applying and stopping order of the bit line current and word line current.

In this example, the plurality of storing elements can be connected to one reading transistor. Thus, the higher capacity can be attained without any limit on the reading transistor area.

Second Example

Figure 11:
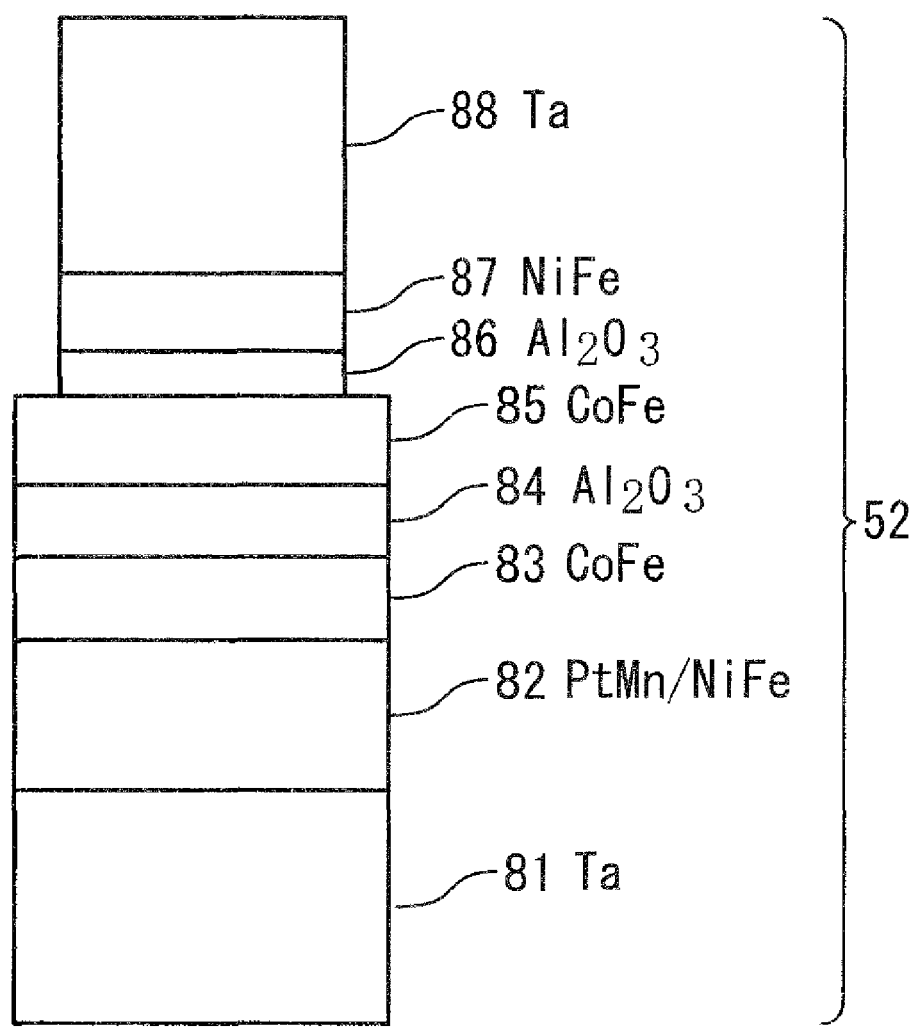
FIG. 11 is a main sectional view of the TMR element in FIG. 7.

FIG. 7 is the schematic configuration view showing a second example of the semiconductor device of the present invention. FIG. 11 is a main sectional view of the TMR element 52 in FIG. 7. The semiconductor device in the second example is substantially equal in the circuit configuration to the first example. However, the configuration of the storing element 52 and the operation of the word line control circuit 57 and the writing method are different.

In the storing element 52, a lower wiring layer 81 (Ta: 10 nm), an anti-ferromagnetic layer 82 (PtMn/NiFe: 10 nm), a pinned layer 83 (CoFe: 2.4 nm), a first tunnel insulating layer 84 ($Al_2O_3$: 2 nm), a free layer 85 (CoFe: 2.4 nm), a second tunnel insulating layer 86 ($Al_2O_3$: 2 nm), a write magnetic layer 87 (NiFe: 5 nm), and an upper wiring layer 88 (Ta: 10 nm) are laminated in this order from the lower layer.

The operating method of the semiconductor storage device 40 will be described below exemplifying the case of using the unit block 53-1 as the writing/reading target.

The writing operation of the memory array 41 will be described below exemplifying the case of executing the writing to the memory cell M31. At first, the word line control circuit 57 turns off all of the reading transistors 54-1 to 54-$m$ by using the block selection lines 56-1 to 56-$p$ in the unit blocks 53-1 to 53-$p$. Next, the word line control circuit 57 and the word line termination circuit 58 set the potential of the word line 50-3, to which the writing is executed in the unit block 53-1, to 2 V. Also, the word line control circuit 57 turns on the transistor 67 for connecting the other word line 50-$ix$ in the unit block 53-1 and the wiring to which the potential Vs1 of 0 V is applied. Thus, the write current flows through the storing element 52 in the write memory cell M31. After the write current flows from the word line 50-3 to the storing element 52 in the memory cell 31, this is substantially uniformly divided. Then, they flow through the other storing elements 52 in the same assistant bit line 51-1 and then flow through the other word line 50-$ix$. This becomes about ⅓ when the 64 number of storage elements 52 are connected such as this example. Also, the bit line termination circuit 60 gives the potential of about 0.2 V to the bit line 55-1, and the evaluation control circuit 69 sets the potential Vs2, which differs from this, to the set potential of the potential setting circuit 59-1. Thus, the bit line write current IBL of both polarities, for example, ±1 mA flows through the bit line 55-1. The magnetic field generated by this bit line write current IBL sets the direction of the magnetization of the write magnetic layer 87 formed in the vicinity of the free layer 87 in the storing element 52. The write magnetic layer 87 is set to have small magnetic anisotropy. Thus, the direction of the magnetization easily obeys the magnetic field through the bit line 55-1, and the current value is suppressed to a small value. Hence, the spin electrons in the write magnetic layer 87 flow into the free layer 85, and the magnetization direction of the free layer 85 can be set. Since the write current is small in the other storing elements 52 on the same assistant bit line 51-1, the writing is not executed. Based on this procedure, the writing to one memory cell M31 can be executed.

The reading operation will be described below exemplifying the case of reading from the memory cells M31 to M3$m$. The word line control circuit 57 activates one block selection line 56-1 inside the memory array 41 and turns on all of the reading transistors 54-1 to 54-$m$ connected to the assistant bit lines 51-1 to 51-$m$ inside the unit block 53-1. Next, the word line control circuit 57 turns on the transistor 66 for connecting the word line 50-3, from which the reading is executed, and the wiring to which the reading voltage Vr is applied. The other word lines 50-$ix$ are set at the floating state. When the evaluation control circuit 69 sets the input voltages Vs2 of the potential setting circuits 59-1 to 59-$m$ to the zero potential, the reading current flows through the storing element 52 connected to the word line 50-3, from which the reading is executed, to the other storing elements 52 connected to the same assistant bit line 51-$j$ and the bit line 55-$j$. For example, with regard to the memory cell M31, the reading current flows from the word line 50-3 to the storing element 52 of the memory cell M31, then, to the assistant bit line 51-1, after that, to the bit line 55-1, and finally, to the sensing circuit 64-1. In addition, the reading current flows from the word line 50-3 to the storing element 52 of the memory cell M31, then, to the assistant bit line 51-1, after that, to the storing element 52 of the memory cells M11 to Mn1 (except the memory cell M31), and finally, to the word lines 50-1 to 50-$n$ (except 50-3). When the first tunnel insulating layer 84 is set to be sufficiently lower in resistance value than the second tunnel insulating layer 86, the resistance value of the storing element 52 is substantially determined by the relation between the magnetization directions of the free layer 85 and the pinned layer 83. After that, after the elapse of the desirable time, for example, 10 ns, the evaluation control circuit 69 activates the sensing circuits 64-1 to 64-$m$ based on the control signal of the reading start line 65 and instructs the execution of the judging process. The sensing circuits 64 output the data OUTb1 to OUTb$m$ of all bits (the TMR elements 52) on the word line 50-3 from which the reading is executed.

FIG. 12 is a table showing a relation between the minimum difference of Ibit and (n−1) and (Rtr/Rj). This table shows the result in which the relation between the minimum difference of Ibit based on the TMR resistance, (n−1) and (Rtr/Rj) is calculated, when the TMR resistance value Rj of each storing element 52 has 1 kΩ and 1.5 kΩ based on the data, the on-resistance value of the reading transistor 54 is 100Ω, and Vr is given such that the voltage applied to the memory cell from which the reading is executed is 1 V, and Vs2 is 0 V. With regard to m, as it became greater, the Ibit minimum difference became smaller. In this example, Vs1 is not connected. In FIG. 12, As (n−1) becomes smaller and especially as (Rtr/Rj) becomes smaller, the Ibit minimum difference becomes larger, and the data judgment becomes easier. In the configuration of FIG. 7 ((n−1)=63, (Rtr/Rj)=0.1), the Ibit difference becomes negative. Thus, the condition change policy in which n is set to about 8 ((n−1)=0.01, Rtr/Rj=0.1) or Rtr is decreased to about 10Ω ((n−1)=63, (Rtr/Rj)=0.01) can be obtained, and the Ibit difference becomes 67 μA and 78 μA, respectively.

In this example, the spin electron transfer method of using the write magnetic layer is employed, which can make the write current small and can save the electric power.

Second Exemplary Embodiment

The second exemplary embodiment of the semiconductor storage device of the present invention will be described below with reference to the attached drawings.

Figure 13:
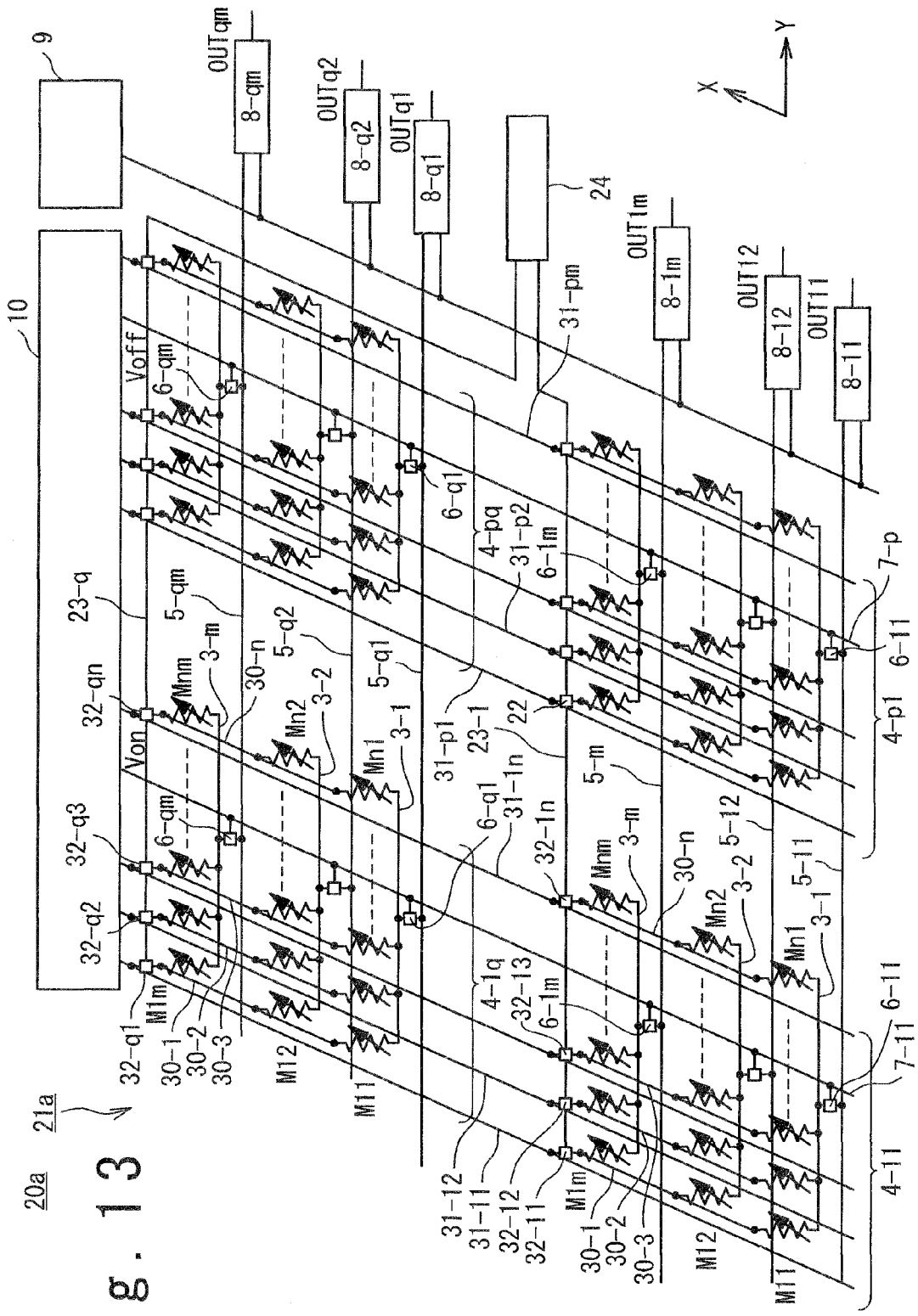
FIG. 13 is a block diagram showing a configuration of a second exemplary embodiment of the semiconductor storage device of the present invention.

FIG. 13 is a block diagram showing a configuration of a second exemplary embodiment of the semiconductor storage device of the present invention. A semiconductor storage device 20a includes a resistive storage element array 21a, a plurality of evaluation circuits 8-11 to 8-1m, - - - , 8-q1 to 8-qm (hereafter, m and q are natural numbers), the evaluation control circuit 9, a first reading control circuit 10 and a second reading control circuit 24. The second exemplary embodiment differs from the first exemplary embodiment in that the unit block 4 in the resistive storage element array 21 is two-dimensionally expanded.

The resistive storage element array 21a includes a plurality of unit blocks 4-11 to 4-pq (hereafter, p is a natural number) provided in a matrix shape with p rows and q columns. Each of the plurality of unit blocks 4-11 to 4-pq (hereafter, a unit block 4-rs (1≦r≦p, 1≦s≦q) includes a plurality of memory cells M11 to Mnm (hereafter, n is a natural number), a plurality of word lines 31-r1 to 31-rn, a plurality of assistant word lines 30-1 to 30-n, a plurality of bit lines 5-s1 to 5-sm, a plurality of assistant bit lines 3-1 to 3-m, a plurality of first switch elements 6-s1 to 6-sm, a switch element control line 7-r, a plurality of second switch elements 32-s1 to 32-sn, and a block selection line 23-s.

The plurality of memory cells M11 to Mnm are arrayed in a matrix shape. Each of the plurality of memory cells M1 to Mnm includes the resistive storage element 1, which stores the data based on the resistance state and has at least two terminals. The resistive storage element 1 in the memory cell Mij (hereafter, 1≦i≦n, 1≦j≦m) is connected to the assistant word line 30-i at one end, and connected to the assistant bit line 3-j at the other end, respectively. The resistive storage element 1 is exemplified as the magnetoresistive element or the phase-change resistive element.

The plurality of word lines 31-r1 to 31-rn is connected to the reading control circuit 10 at one ends and extended in the X-direction. The word line 31-ri is connected to one ends of the second switch elements 32-1i to 32-qi. The plurality of assistant word lines 30-1 to 30-n are provided correspondingly to the plurality of word lines 31-r1 to 31-rn, respectively, and extended in the X-direction. The assistant word line 30-i is connected to the other end of the second switch element 32-si and one ends of the resistive storage elements 1 in the memory cells Mi1 to Mim, respectively. The second switch element 32-si is connected to the assistant word line 30-i at one end, connected to the word line 31-ri at the other end, and connected to the block selection line 23-s at the terminal to control the switch operation, respectively. The block selection line 23-s is connected to the second reading control circuit 24 at one end and extended in the Y-direction. The block selection line 23-s is connected to the terminal to control the respective switch operations of the second switch elements 32-s1 to 32-sn. Each of the second switch elements 32-s1 to 32-sn is turned on and off based on the potential of the block selection line 23-s and operated for each of the unit blocks 4-1s to 4-ps (columns).

The plurality of assistant bit lines 3-1 to 3-m are extended in the Y-direction that is substantially vertical to the X-direction. The assistant bit line 3-j is connected to the other ends of the resistive storage elements 1 in the memory cells M1j to Mmj. The first switch element 6-sj is connected to the assistant bit line 3-j at one end, connected to the bit line 5-sj at the other end, and connected to the switch element control line 7-r at the terminal to control the switch operation, respectively. The switch element control line 7-r is connected to the reading control circuit 10 at one end and extended in the X-direction. The switch element control line 7-r is connected to the terminals to control the respective switch operations of the first switch elements 6-s1 to 6-sm. Each of the first switch elements 6-s1 to 6-sm is turned on and off based on the potential of the switch element control line 7-r and operated for each of the unit blocks 4-r1 to 4-rq (rows). The plurality of bit lines 5-s1 to 5-sm is extended in the Y-direction that is substantially vertical to the X-direction. The bit line 5-sj is connected to the evaluating circuit 8-sj at one end. Also, the bit line 5-sj is connected to the other ends of the respective switch elements 6-sj in the plurality of unit blocks 4-1s to 4-ps, respectively.

The evaluating circuit 8-sj is connected to the bit line 5-sj and the evaluation control circuit 9. Based on the control signal from the evaluation control circuit 9, the potential of the bit line 5-sj or the current flowing through the bit line 5-sj is evaluated. When the data are read from all of the memory cells Mi1 to Mim along the assistant word line 30-i in the unit block 4-rs of the reading target, in order to evaluate the potentials or currents of all of the bit lines 5-s1 to 5-sm connected to the memory cells Mi1 to Mim, the evaluation control circuit 9 makes the evaluating circuits 8-s1 to 8-sm operate at the substantially same time. The first reading control circuit 10 selects the word line 31-ri corresponding to the memory cells Mi1 to Mim of the unit block 4-rs of the reading target from the plurality of word lines 31-r1 to 31-rn. This has the potential setting function or current applying function. Also, the switch elements 6-s1 to 6-sm are turned on, based on the potential of the switch element control line 7-r in the unit block 4-rs of the reading target. Moreover, the reading control circuit 10 has the function for applying the predetermined potential to the word line 31 from which the reading is not executed, or the function for floating the word line 31 from which the reading is not executed.

The second reading control circuit 24 selects the block selection line 23-s corresponding to the unit block 4-rs of the reading target from the plurality of block selection lines 23-1 to 23-q. Consequently, based on the potential of the block selection line 23-s, the second switch elements 32-s1 to 32-sn connected to the block selection line 23-s are turned on. Thus, the word line 31-ri is connected through the second switch element 32-si to the assistant word line 30-i. As a result, the reading control circuit 10 applies the potential through the word line 31-ri, the second switch element 32-si and the assistant word line 30-i to the resistive storage elements 1 in Mi1 to Mim.

Since the second reading control circuit 24 selects the block selection line 23-s and the reading control circuit 10 selects the switch element control line 7-r, the unit block 4-rs of the reading target is selected.

The operation in this exemplary embodiment of the semiconductor storage device in the present invention will be described below. At first, the reading operation will be described. Here, as an example, a case of reading from the resistive storage elements 1 in the memory cells M31 to M3$m$ in the unit block 4-1$q$ in FIG. 13 will be described. At first, by the first reading control circuit 10, the first switch elements 6-$q$1 to 6-$qm$ in the unit block 4-1$q$ of the reading target are turned on, and the first switch elements 6-$q$1 to 6-$qm$ in the unit block 4-$rxsx$ (hereafter, $1 \leq rx$ ($rx \neq 1$)$\leq p$, $1 \leq sx \leq q$) that are not the reading target are turned off. Simultaneously, by the second reading control circuit 20, the second switch elements 32-$q$1 to 32-$qn$ in the unit block 4-1$q$ of the reading target are turned on, and the second switch elements 32-$q$1 to 32-$qn$ in the unit block 4-$rysy$ (hereafter, $1 \leq ry \leq p$, $1 \leq sy$ ($sy \neq q$)$\leq q$) that are not the reading target are turned off.

Next, by the reading control circuit 10, a potential difference is generated between the assistant word line 30-3 of the reading target in the unit block 4-1$q$ and the bit lines 5-$q$1 to 5-$qm$. For example, a potential is applied or a current is supplied through the word line 31-13 and the second switching element 32-$q$3 to the assistant word line 30-3. The assistant word line 30-$ix$ ($ix \neq 3$) that is not the reading target in the unit block 4-1$q$ is set at a predetermined potential or set at an opened state by the reading control circuit 10 through the word line 31-1$ix$ ($ix \neq 3$) that is not the reading target and the second switching element 32-$qix$. The word lines 31-$sxl$ to 31-$sxn$ in the unit block 4-$rxsx$ which are not the reading target are set at the predetermined potential or set at the opened state by the reading control circuit 10.

Next, the evaluating circuits 8-$q$1 to 8-$qm$ connected to all of the bit lines 5-$q$1 to 5-$qm$ connected to the unit block 4-1$q$ are operated at the substantially same time by the evaluation control circuit 9. Thus, the evaluating circuits 8-1 to 8-$m$ evaluate the potentials or currents of the bit lines 5-1 to 5-$m$ and consequently evaluate the resistance values of the resistive storage elements 1 in the memory cells M31 to M3$m$ and judge the data. The evaluating circuits 8-1 to 8-$m$ output the judged data as read data OUT$q$1 to OUT$qm$.

In FIG. 13, the evaluating circuit 8 is installed for each of the bit lines 5-11 to 5-$qm$. However, by installing and sharing the circuit for selecting the bit line 5 in the unit block 4 from which the reading is executed, the number of the evaluating circuits 8 can be reduced.

The writing process of the data can be executed by supplying the write current to each of the bit line 5-$sj$ and the word line 31-$ri$ corresponding to the memory cell Mij to which the writing is executed. This is executed by, for example, using the means for changing the resistance state of each resistive storage element that is separately provided.

Also, in this exemplary embodiment, the resistance values, which can be obtained from the data of the resistive storage element 1, and the values m, n, Rin, Rtr, Vs1 and Vs2 are assumed to be the combinations that satisfy the first condition indicated in the first exemplary embodiment.

According to the semiconductor storage device of the present invention, the unit blocks can be arranged in an array shape and the peripheral circuit can be shared, thereby attaining the higher integration and the higher capacity.

Third Example

Figure 14:
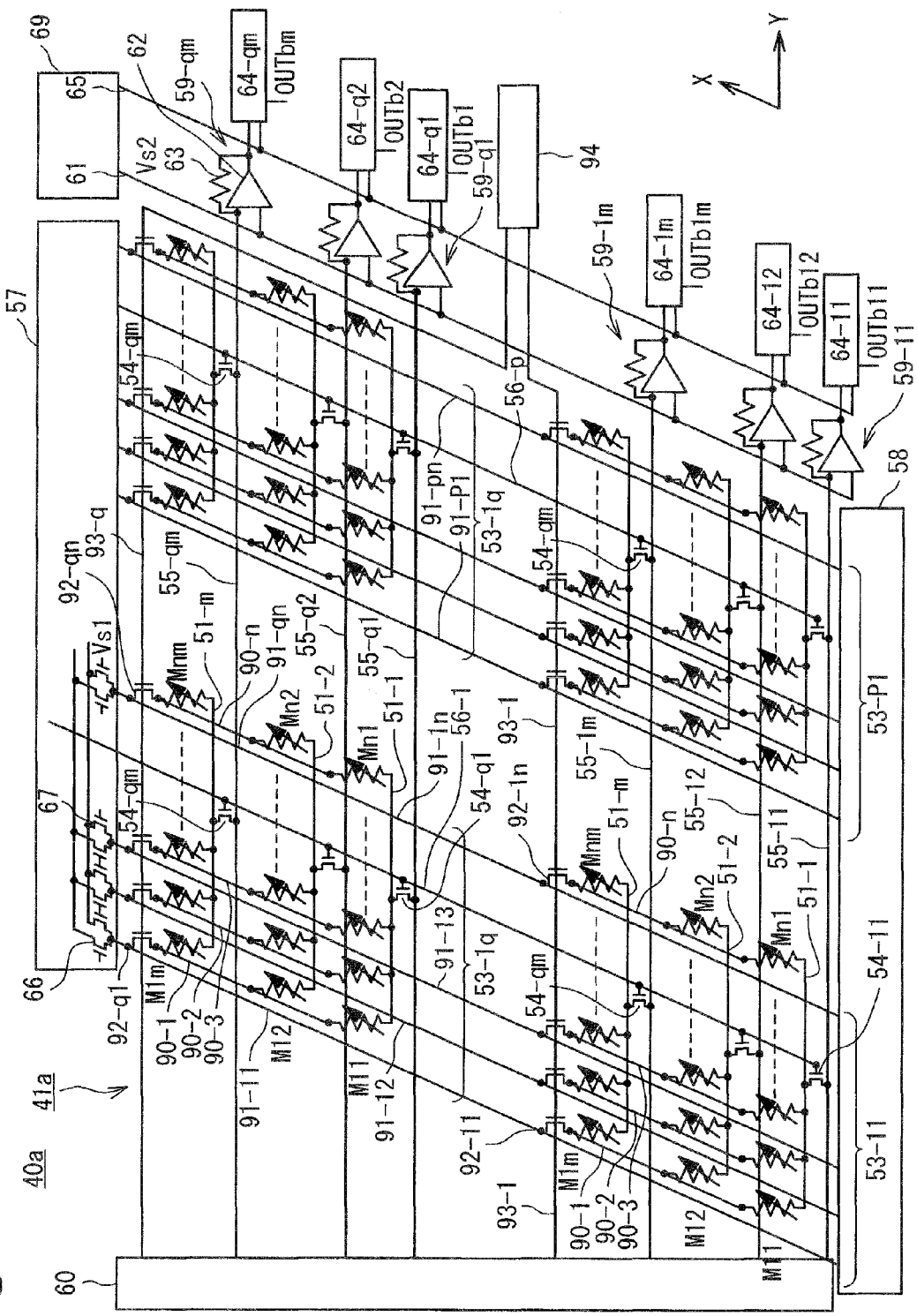
FIG. 14 is a schematic configuration view showing a third example of the semiconductor device of the present invention.

The exemplary embodiment of the present invention will be described below using the specific example. FIG. 14 is a schematic configuration view showing a third example of the semiconductor device in the present invention. A semiconductor storage device 40$a$ includes a resistive storage element array 41$a$, a plurality of sensing circuits 64-11 to 64-1$m$, - - -, 64-$q$1 to 64-$qm$, an evaluation control circuit 59, the word line control circuit 57, a word line termination circuit 58, a bit line termination circuit 60, a plurality of potential setting circuits 59-11, 59-$lm$, - - -, 59-$q$1 to 59-$qm$, a reading word block selection 94.

The resistive storage element array 41$a$, the sensing circuits 64-11 to 64-$qm$, the unit blocks 53-11 to 53-$pq$, the memory cells M11 to Mnm in each unit block 53-$rs$, the TMR element 52, a plurality of word lines 91-$r$1 to 91-$rn$, a plurality of assistant word lines 90-1 to 90-$n$, the plurality of bit lines 55-$s$1 to 55-$sm$, the plurality of assistant bit lines 51-1 to 51-$m$, the plurality of reading transistors 54-$s$1 to 54-$sm$, the block selection line 56-$r$, a plurality of assistant word line selection transistors 92-$r$1 to 92-$rn$, a block selection line 93-$s$ and a reading word block selection circuit 94 correspond to the resistive storage element array 21$a$, the evaluating circuits 64-11 to 64-$qm$, the unit blocks 4-11 to 4-$pq$, the memory cells M11 to Mnm in each unit block 4-$rs$, the resistive storage element 1, the plurality of word lines 31-$r$1 to 31-$rn$, the plurality of assistant word lines 30-1 to 30-$n$, the plurality of bit lines 5-$s$1 to 5-$sm$, the plurality of assistant bit lines 3-1 to 3-$m$, the plurality of first switch elements 6-$s$1 to 6-$sm$, the switch element control line 7-$r$, the plurality of second switch elements 32-$s$1 to 32-$sn$, the block selection line 23-$s$, and the second reading control circuit 24, in FIG. 13, respectively. They execute similar operations.

The potential setting circuit 59-$sj$ is connected to the bit line 5-$sj$ and the set potential applying line 61 at an input side, and connected to the sensing circuit 64-$sj$ at an output side, respectively. In response to the input of the potential Vs2 from the set potential applying line 61, the potential setting circuit 59-$sj$ set the potential of the bit line 5-$sj$ to Vs2. Then, the potential setting circuit 59-$sj$ outputs the current flowing through the bit line 5-$sj$ to the sensing circuit 64-$sj$. The potential setting circuit 59-$sj$ is composed of the differential amplifier 62 and the feedback resistor 63. One input of the differential amplifier 62 is set to the potential Vs2 of the set potential applying line 61, and the other input is connected to the bit line 5-$sj$. Moreover, the output of the differential amplifier 62 is set to the value in which the potential of the bit line 5-$sj$ connected through the feedback resistor 63 is the potential Vs2.

The word line control circuit 57 corresponds to the reading control circuit 10 and executes the similar operations. The word line 91-$ri$ of the reading target is set at the reading voltage Vr, and the word line 91-$rix$ that is not the reading target is set at the potential Vs1. The word line control circuit 57 is composed of the transistors 66, 67. As for the word line 91-$rix$ that is not the reading target, one input of the transistor 67 is set at the potential Vs1, and the transistor 67 is turned on and connected to the word line 91-$rix$. On the other hand, as for the word line 91-$ri$ of the reading target, the transistor 66 is turned on, and the reading voltage Vr is applied to the word line 91-$ri$. Also, in the unit block 53-$rs$ of the reading target, the reading block selection line 56-$r$ is set at the high potential, and the transistors 6-$s$1 to 6-$sm$ are turned on.

The evaluation control circuit 69 corresponds to the evaluation control circuit 9 and executes the similar operations. The control signal to start the process for executing the judgment and outputting the data is supplied to the reading start line 65, and the sensing circuit 64-$sj$ is operated. In addition, the set potential applying line 61 is set at the potential Vs2.

The word line termination circuit 58 terminates the other ends of the plurality of word lines 91-11 to 91-$pn$ and the other ends of the block selection lines 56-1 to 56-$p$. The bit line termination circuit 60 terminates the other ends of the plurality of bit lines 55-11 to 55-$qm$ and the other ends of the block selection lines 93-1 to 93-$q$.

Each unit block 53 is provided with the 64 number (n=64) of word lines 91 and assistant word lines 90, and the 128 number (m=128) of bit lines 55 and assistant bit lines 51. Then, the 32 number (p=32) of unit blocks 53 are connected through the common main bit lines 55, and the 16 number (q=32) of unit blocks 53 are connected through the common word lines 91. Then, the memory of 4M bits is provided.

The TMR element (magnetoresistive element) 52 has the structure that the lower wiring layer 70 (Ta: 10 nm), the anti-ferromagnetic layer 71 (PtMn/NiFe: 10 nm), the pin layer 72 (CoFe: 2.4 nm), the tunnel insulating layer 73 ($Al_2O_3$: 2 nm), the free layer 74 (NiFe: 5 nm) and the upper wiring layer 75 (Ta: 10 nm) are laminated in this order.

The operating method of the semiconductor storage device 40a will be described below exemplifying a case of using the unit block 53-1q as the writing/reading target.

The writing operation of the memory array 41 will be described below exemplifying a case of executing the writing to the memory cell M31 in the unit block 53-1q. At first, the word line control circuit 57 turns off all of the reading transistors 54-11 to 54-qm through the block selection lines 56-1 to 56-p in the unit blocks 53-11 to 53-pq. Next, the reading word block selection circuit 94 turns off all of the assistant word line selection transistors 92-11 to 92-qn through the block selection lines 93-1 to 93-q in the unit blocks 53-11 to 53-pq. Next, the word line control circuit 57 gives the potential to the word line 91-13 in the memory cell M31, to which the writing is executed, in the unit block 53-1q, and the word line termination circuit 58 grounds the opposite end of the word line 91-13. Thus, the word line write current IWL, for example, 3 mA flows between both of them. Also, the bit line termination circuit 60 give the potential of about 0.2 V to the bit line 55-q3, and the evaluation control circuit 69 sets the potential Vs2, which differs from this 0.2 V, for the set potential of the potential setting circuit 59-q3. Thus, the bit line write current IBL having both of the polarities, for example, ±4 mA flows through the bit line 55-q3. With the synthesis magnetic field generated by those write currents, it is possible to set the direction of the magnetization of the free layer in the TMR element 52. Hence, it is possible to change the TMR resistance and execute the writing.

The reading operation will be described below exemplifying a case of reading from the memory cells M31 to M3m in the unit block 53-1q. The word line control circuit 57 activates one block selection line 56-1 inside the memory array 41a and turns on all of the reading transistors 54-q1 to 54-qm connected to the assistant bit lines 51-1 to 51-m inside the unit block 53-1q. Thus, the assistant bit line 51 and the corresponding bit line 55 are connected. Next, the reading word block selection circuit 94 activates one block selection line 93-q inside the memory array 41a and turns on all of the assistant word line selection transistors 92-q1 to 92-qn connected to the assistant word lines 90-1 to 90-n inside the unit block 53-1q. Thus, the assistant word line selection 90 and the corresponding word line 91 are connected. Next, the word line control circuit 57 turns on the transistor 66 for connecting the word line 91-3, from which the reading is executed, and the wiring to which the reading voltage Vr is applied. As for the other word line 91-ix, the transistor 67 for connecting the wirings to which the potential Vs1 is applied and the potential of the word line 91-ix is applied is turned on and set at the potential Vs1. When the evaluation control circuit 69 sets the input voltages Vs2 of the potential setting circuits 59-q1 to 59-qm to the zero potential, the reading current flows through the TMR element 52 connected to the assistant word line 90-3, from which the reading is executed, to the other TMR element 52 connected to the same assistant bit line 51-j and the bit line 55-j. For example, with regard to the memory cell M31, the reading current flows from the word line 91-13 to the assistant word line 90-3, then, to the TMR element 52 of the memory cell M31, after that, to the assistant bit line 51-1, then, to the bit line 55-q1, and finally, to the sensing circuit 64-q1. In addition, the reading current flows from the assistant word line 90-3 to the TMR element 52 of the memory cell M31, then, to the assistant bit line 51-1, after that, to the TMR elements 52 of the memory cells M11 to Mn1 (except the memory cell M31), and finally, to the assistant word lines 90-1 to 90-n (except 50-3). After that, after the elapse of the desirable time, for example, 10 ns, the evaluation control circuit 69 starts the sensing circuits 64-q1 to 64-qm based on the control signal of the reading start line 65 and instructs the execution of the judging process. The sensing circuits 64-q1 to 64-qm output data OUTbq1 to OUTbqm of all bits (the TMR element 52) on the word line 90-3 from which the reading is executed.

FIG. 15 is a table showing a relation between the minimum difference of Ibit and (n−1) and (Rtr/Rj). This table shows the result in which the relation among the minimum difference of Ibit, (n−1) and (Rtr/Rj) based on the TMR resistance value is calculated, when the TMR resistance value Rj of each TMR element 52 has 1 kΩ and 1.5 kΩ based on the data, the on-resistance value of the reading transistor 54 has 10Ω, the on-resistance value of the assistant word line selection transistor is 5Ω, and the resistance value of the transistor inside the word control circuit 57 is 5Ω, Vr is given such that the word line from which the reading is executed is 1 V, Vs1 is 0 V, and Vs2 is 0V. The fact that this minimum difference is positive is the requirement to normally execute the reading. Incidentally, m is assumed to be 256. In this case, as (n−1) is smaller and especially as (Rtr/Rj) is smaller, the Ibit minimum difference becomes larger, and the data judgment becomes easier. In the case of this example in which ((Rtr/Rj)=0.01) and n=64, the Ibit difference of 81 μA is obtained.

FIG. 16 is a table showing a relation between the minimum difference of Ibit and (n−1) and (Rtr/Rj). Here, as compared with the case of FIG. 15, this case differs in Vs1 of 0.01 V. In this case, the Ibit minimum difference under the condition that (Rtr/Rj) is 0.01 is improved, and 85 μA is obtained in this example. The optimal Vs1 obeys the other condition. When the attainment of the lower resistance value is difficult, it is assumed that the TMR resistance value Rj is 10 kΩ and 15 kΩ, the on-resistance value of the reading transistor 54 is 100Ω, the on-resistance value of the assistant word line selection transistor is 50Ω, and the resistance value of the transistor inside the word line control circuit 57 is 50Ω, consequently the entire resistance value is set to 10 times as much as before, the Ibit difference of 8.5 μA which is equal to 1/10 of the table in FIG. 16 at Vs1=0.01V can be obtained.

In this embodiment, the sub block from which the reading is executed can be arranged in an array shape not only in the bit line direction but also in the word line direction. Thus, the peripheral circuit can be shared, thereby attaining the structure of the higher capacity.

Incidentally, it is clear that the present invention is not limited to the above-mentioned exemplary embodiments and that the respective exemplary embodiments can be suitably varied or changed within the scope of the technical idea of the present invention.

As mentioned above, according to the present invention, in the configuration in which the plurality of storage cells are connected to one switch to select the cell from which the reading is executed, the reading is possible, which enables the reduction in the cell area and enables the structure of the higher capacity to be obtained.

In this way, in the semiconductor storage device of the present invention, the switch element is shared in the plurality of storing elements, and the higher integration is attained, and while the resistance distinction property between the storing elements is attained, the plurality of storing elements can be read at the same time. Thus, the reading can be executed at the high speed, and the semiconductor storage device that is excellent in the higher integration can be attained.

The invention claimed is:

1. A semiconductor storage device comprising:
a plurality of reading blocks collaterally arranged in a second direction, wherein each of said plurality of reading blocks includes:
a plurality of first wirings extended in a first direction different from said second direction, a plurality of second wirings extended in said second direction, and
a plurality of resistive storage elements arranged at respective points where said plurality of first wirings and said plurality of second wirings intersect and storing data based on variations of resistance values,
wherein each of said plurality of resistive storage elements is connected to a corresponding first wiring among said plurality of first wirings at one end, and connected to a corresponding second wiring among said plurality of second wirings at the other end;
a plurality of third wirings extended in said second direction and provided correspondingly to said plurality of second wirings;
a plurality of first reading switches arranged between each of said plurality of third wirings and said corresponding second wiring among said plurality of second wirings in each of said plurality of reading blocks;
a first control circuit controlling to turn on and off said plurality of first reading switches and supplying a predetermined current or voltage to said plurality of first wirings; and
a plurality of evaluating circuits connected to said plurality of third wirings and evaluating said currents or voltages,
wherein when data is read from each of said plurality of resistive storage elements,
said first control circuit selects a selection reading block from said plurality of reading blocks by said plurality of first reading switches, selects a selection first wiring from said plurality of first wirings in said selection reading block and supplies said predetermined current or voltage, and
said plurality of evaluating circuits executes said evaluations of said currents or voltages in said plurality of third wirings.

2. The semiconductor storage device according to claim 1, wherein said plurality of reading blocks is collaterally installed in said first direction and said second direction,
wherein said semiconductor storage device further comprises:
a plurality of fourth wirings extended in said first direction and provided correspondingly to said plurality of first wirings;
a plurality of second reading blocks arranged between each of said plurality of fourth wirings and said corresponding first wiring among said plurality of first wirings in each of said plurality of reading blocks; and
a second control circuit controlling to turn on and off said plurality of second reading switches,
wherein when said reading operation of data from each of said plurality of resistive storage elements,
said second control circuit controls said plurality of second reading switches and said first control circuit controls said plurality of first reading switches so that said selection reading block is selected from said plurality of reading blocks,
said first control circuit selects a selection fourth wiring from said plurality of fourth wirings in said selection reading block so that said selection first wiring is selected and said predetermined current or voltage is supplied to said selection first wiring,
said plurality of evaluating circuit executes said evaluations of said currents or voltages in said plurality of third wirings.

3. The semiconductor storage device according to claim 2, wherein in said selection reading block in said reading operation of said data,
when one resistance value among a plurality of resistive storage elements of reading targets in said plurality of resistive storage elements is defined as Rja, resistance values of said resistive storage elements connected to said same second wiring among said plurality of resistive storage elements are defined as Rjb, resistance values of said resistive storage elements having said resistance values except Rja among said plurality of resistive storage elements of said reading targets are defined as Rjc, said resistance values of remaining resistive storage elements among said plurality of resistive storage elements are defined as Rjd, an on-resistance value of said first reading switch is defined as Rtr, and a potential applied to said first wiring from which said reading is not executed is defined as Vs1, and said sum of said resistance value of said first wiring from which said reading is not executed and said resistance value between said first wiring and a power source Vs1 is defined as Rin, a potential of said first wiring from which said reading is executed is defined as Vr, and a potential of said third wiring at said time of said reading operation is defined as Vs2, respectively,
in an equivalent circuit in which said respective Rjb, Rjc and Rjd are assumed to have said same resistance values,
when said maximum and minimum resistance values that Rjb, Rjc and Rjd can take are assumed to be Rjbmax, Rjcmax and Rjdmax, and Rjbmin, Rjcmin and Rjdmin, respectively, a function f=Ibit (Rjb, Rjc, Rjd)=f (Rja, m, n, Rin, Rtr, Vs1, Vs2, Rjb, Rjc, Rjd) to calculate a read current Ibit derived from said equivalent circuit is used, and said resistance value of said resistive storage element of said reading target is Rja,
said maximum value of Ibit is represented by Ibitmax (Rja)=MAX (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rbmin, Rjcmin, Rjdmax) and Ibit (Rjbmin, Rjcmin, Rjdmin)), and said minimum value is represented by Ibitmin (Rja)= MIN (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax) Ibit (Rjbmax, Rjcmin, Rjdmin), Ibit (Rjbmin, Rjcmax, Rjdmin) Ibit (Rjbmin, Rjcmin, Rjdmax), and Ibit (Rjbmin, Rjcmin, Rjdmin)),
wherein MAX (a, b, c) is said function for indicating said maximum value among a, b and c, and MIN (a, b, c) is said function for indicating said minimum value among a, b and c,
wherein Rja has the p number of values of Rja1 to Rjap, and when Rjag is a smaller value in adjacent two resistance values Rjag and Rjah, Ibitmin (Rjag)−Ibitmax (Rjah)>0 is established in all of said combinations of Rja1 to Rjap.

4. The semiconductor storage device according to claim 3, wherein said function f is represented by said following equation, $$f(Rja,m,n,Rin,Rtr,Vs1,Vs2,Rjb,Rjc,Rjd)=(-B/Rjd+Rjd\cdot(m1)\cdot D\cdot/Rt-Vs2\cdot(m-1)/Rtr-Vr/Rjc+Rjd\cdot D/Rjc+D)/(A/Rjd-Rjd\cdot(m-1)\cdot C/Rtr-Rjd\cdot C/Rc-C),$$

wherein
A=Rjb+Rtr+Rjb·Rtr/Rja,
B=Vs2−Rjb(Vr−Vs2)/Rja,
C=A·(n−1)/Rin−Rtr/Rjb+A/Rjb, and
D=B·(n−1)/Rin−Vs1·(n−1)/Rin−Vs2/Rjb+B/Rjb+B/Rjd.

5. The semiconductor storage device according to claim 4, wherein said plurality of resistive storage elements is said magnetoresistive elements.

6. The semiconductor storage device according to claim 1, wherein, said control circuit applies a predetermined current or voltage to said plurality of first wirings except said selection first wiring in said selection reading block, when said reading operation of said data.

7. The semiconductor storage device according to claim 1, further comprising a non-linear resistance element in which said resistive storage element is built or to which said resistive storage element is connected.

8. The semiconductor storage device according to claim 1, wherein in said selection reading block in said reading operation of said data,
when one resistance value among a plurality of resistive storage elements of reading targets in said plurality of resistive storage elements is defined as Rja, resistance values of said resistive storage elements connected to said same second wiring among said plurality of resistive storage elements are defined as Rjb, resistance values of said resistive storage elements having said resistance values except Rja among said plurality of resistive storage elements of said reading targets are defined as Rjc, said resistance values of remaining resistive storage elements among said plurality of resistive storage elements are defined as Rjd, an on-resistance value of said first reading switch is defined as Rtr, and a potential applied to said first wiring from which said reading is not executed is defined as Vs1, and said sum of said resistance value of said first wiring from which said reading is not executed and said resistance value between said first wiring and a power source Vs1 is defined as Rin, a potential of said first wiring from which said reading is executed is defined as Vr, and a potential of said third wiring at said time of said reading operation is defined as Vs2, respectively,
in an equivalent circuit in which said respective Rjb, Rjc and Rjd are assumed to have said same resistance values,
when said maximum and minimum resistance values that Rjb, Rjc and Rjd can take are assumed to be Rjbmax, Rjcmax and Rjdmax, and Rjbmin, Rjcmin and Rjdmin, respectively, a function f=Ibit (Rjb, Rjc, Rjd)=f (Rja, m, n, Rin, Rtr, Vs1, Vs2, Rjb, Rjc, Rjd) to calculate a read current Ibit derived from said equivalent circuit is used, and said resistance value of said resistive storage element of said reading target is Rja,
said maximum value of Ibit is represented by Ibitmax (Rja)=MAX (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rbmin, Rjcmin, Rjdmax) and Ibit (Rjbmin, Rjcmin, Rjdmin)), and said minimum value is represented by Ibitmin (Rja)= MIN (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rjbmin, Rjcmin, Rjdmax), and Ibit (Rjbmin, Rjcmin, Rjdmin)),
wherein MAX (a, b, c) is said function for indicating said maximum value among a, b and c, and MIN (a, b, c) is said function for indicating said minimum value among a, b and c,
wherein Rja has the p number of values of Rja1 to Rjap, and when Rjag is a smaller value in adjacent two resistance values Rjag and Rjah, Ibitmin (Rjag)−Ibitmax (Rjah)>0 is established in all of said combinations of Rja1 to Rjap.

9. The semiconductor storage device according to claim 8, wherein said function f is represented by said following equation, $$f(Rja,m,n,Rin,Rtr,Vs1,Vs2,Rjb,Rjc,Rjd)=(-B/Rjd+Rjd\cdot(m-1)\cdot D\cdot/Rt-Vs2\cdot(m-1)/Rtr-Vr/Rjc+Rjd\cdot D/Rjc+D)/(A/Rjd-Rjd\cdot(m-1)\cdot C/Rtr-Rjd\cdot C/Rc-C),$$

wherein
A=Rjb+Rtr+Rjb·Rtr/Rja,
B=Vs2−Rjb(Vr−Vs2)/Rja,
C=A·(n−1)/Rin−Rtr/Rjb+A/Rjb, and
D=B·(n−1)/Rin−Vs1·(n−1)/Rin−Vs2/Rjb+B/Rjb+B/Rjd.

10. The semiconductor storage device according to claim 1, wherein said plurality of resistive storage elements is said magnetoresistive elements.

11. A reading method of a semiconductor storage device, wherein said semiconductor storage device comprises:
a plurality of reading blocks collaterally arranged in a second direction, wherein each of said plurality of reading blocks includes:
a plurality of first wirings extended in a first direction different from said second direction,
a plurality of second wirings extended in said second direction, and
a plurality of resistive storage elements arranged at respective points where said plurality of first wirings and said plurality of second wirings intersect and storing data based on variations of resistance values,
wherein each of said plurality of resistive storage elements is connected to a corresponding first wiring among said plurality of first wirings at one end, and connected to a corresponding second wiring among said plurality of second wirings at the other end,
a plurality of third wirings extended in said second direction, and provided correspondingly to said plurality of second wirings
a plurality of first reading switches arranged between each of said plurality of third wirings and said corresponding second wiring among said plurality of second wirings in each of said plurality of reading blocks,
a first control circuit controlling to turn on and off said plurality of first reading switches and supplying a predetermined current or voltage to said plurality of first wirings, and
a plurality of evaluating circuits connected to said plurality of third wirings and evaluating said currents or voltages,
wherein said reading method of said semiconductor storage device comprising:
(a) said first control circuit selecting a selection reading block from said plurality of reading blocks by turning on said plurality of first reading switches;

(b) said first control circuit selecting a selection first wiring from said plurality of first wirings in said selection reading block and supplying said predetermined current or voltage; and (c) said plurality of evaluating circuits executing said evaluations of said currents or voltages in said plurality of third wirings at said substantially same time.

12. The reading method of the semiconductor storage device according to claim 11, wherein said plurality of reading blocks is collaterally installed in said first direction and said second direction, wherein said semiconductor storage device further comprises:

a plurality of fourth wirings extended in said first direction and provided correspondingly to said plurality of first wirings, a plurality of second reading blocks arranged between each of said plurality of fourth wirings and said corresponding first wiring among said plurality of first wirings in each of said plurality of reading blocks, and a second control circuit controlling to turn on and off said plurality of second reading switches, wherein said step (a) includes:

(a1) said second control circuit turning on said plurality of second reading switches, and (a2) said first control circuit turning on said plurality of first reading switches so that said selection reading block is selected from said plurality of reading blocks, wherein said step (b) includes:

(b1) said first control circuit selecting said selection fourth wiring from said plurality of fourth wirings in said selection reading block so that said selection first wiring is selected and said predetermined current or voltage is supplied to said selection first wiring.

13. The reading method of the semiconductor storage device according to claim 11, wherein, said step (b) includes:

(b2) said control circuit applying a predetermined current or voltage to said plurality of first wirings except said selection first wiring in said selection reading block.

14. The reading method of the semiconductor storage device according to claim 11, wherein in said selection reading block, when one resistance value among a plurality of resistive storage elements of reading targets in said plurality of resistive storage elements is defined as Rja, resistance values of said resistive storage elements connected to said same second wiring among said plurality of resistive storage elements are defined as Rjb, resistance values of said resistive storage elements having said resistance values except Rja among said plurality of resistive storage elements of said reading targets are defined as Rjc, said resistance values of remaining resistive storage elements among said plurality of resistive storage elements are defined as Rjd, an on-resistance value of said first reading switch is defined as Rtr, and a potential applied to said first wiring from which said reading is not executed is defined as Vs1, and said sum of said resistance value of said first wiring from which said reading is not executed and said resistance value between said first wiring and a power source Vs1 is defined as Rin, a potential of said first wiring from which said reading is executed is defined as Vr, and a potential of said third wiring at said time of said reading operation is defined as Vs2, respectively, in said equivalent circuit in which said respective Rjb, Rjc and Rjd are assumed to have said same resistance values, when said maximum and minimum resistance values that Rjb, Rjc and Rjd can obtain are assumed to be Rjbmax, Rjcmax and Rjdmax, and Rjbmin, Rjcmin and Rjdmin, respectively, when a function f=Ibit (Rjb, Rjc, Rjd)=f (Rja, m, n, Rin, Rtr, Vs1, Vs2, Rjb, Rjc, Rjd) to calculate a read current Ibit derived from said equivalent circuit is used and said resistance value of said resistive storage element of said reading target is Rja, said maximum value of Ibit is represented by Ibitmax (Rja)=MAX (Ibit (Rjbmax, Rjcmax, Rjdmax), Ibit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rbmin, Rjcmin, Rjdmax) and Ibit (Rjbmin, Rjcmin, Rjdmin)), and said minimum value is represented by Ibitmin (Rja)= MIN (Ibit (Rjbmax, Rjcmax, Rjdmax), Tbit (Rjbmax, Rjcmax, Rjdmin), Ibit (Rjbmax, Rjcmin, Rjdmax), Ibit (Rjbmin, Rjcmax, Rjdmax), Ibit (Rjbmax, Rjcmin, Rjdmin), Ibit (Rjbmin, Rjcmax, Rjdmin), Ibit (Rjbmin, Rjcmin, Rjdmax), and Ibit (Rjbmin, Rjcmin, Rjdmin)), wherein MAX (a, b, c) is said function for indicating said maximum value among a, b and c, and MIN (a, b, c) is said function for indicating said minimum value among a, b and c, wherein Rja has the p number of values of Rja1 to Rjap and when Rjag is a smaller value in adjacent two resistance values Rjag and Rjah, Ibitmin (Rjag)−Ibitmax (Rjah)>0 is established in all of said combinations of Rja1 to Rjap.

15. The reading method of the semiconductor storage device according to claim 11, wherein said function f is represented by said following equation, $$f(Rja,m,n,Rin,Rtr,Vs1,Vs2,Rjb,Rjc,Rjd)=(-B/Rjd\cdot Rjd\cdot(m-1)\cdot D\cdot/Rt-Vs2\cdot(m-1)/\cdot Rtr-Vr/Rjc+Rjd\cdot D/Rjc+D)/(A/Rjd-Rjd\cdot(m-1)\cdot C/Rtr-Rjd\cdot C/Rc-C),$$

wherein $A=Rjb+Rtr+Rjb\cdot Rtr/Rja$, $B=Vs2-Rjb(Vr-Vs2)/Rja$, $C=A\cdot(n-1)/Rin-Rtr/Rjb+A/Rjb$, and $D=B\cdot(n-1)/Rin-Vs1\cdot(n-1)/Rin-Vs2/Rjb+B/Rjb+B/Rjd$.

* * * * *